(12) United States Patent
Subrahmanyam et al.

(10) Patent No.: US 12,713,555 B2
(45) Date of Patent: Aug. 18, 2026

(54) LIQUID COOLED COLD PLATE FOR MULTIPLE SEMICONDUCTOR CHIP PACKAGES

(71) Applicant: Intel Corporation, Santa Clara, CA (US)

(72) Inventors: Prabhakar Subrahmanyam, San Jose, CA (US); Jack D. Mumbo, Beaverton, OR (US); Carl D. Williams, Manitou Springs, CO (US); Steven C. Miller, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 355 days.

(21) Appl. No.: 17/676,105

(22) Filed: Feb. 18, 2022

(65) Prior Publication Data

US 2022/0173015 A1 Jun. 2, 2022

(51) Int. Cl.
*H05K 7/20* (2006.01)

(52) U.S. Cl.
CPC ................................ *H05K 7/20254* (2013.01)

(58) Field of Classification Search
CPC . H01L 23/473; H01L 23/467; H01L 21/3212; H01L 23/4093; H01L 23/3672; H01L 23/3677; H05K 7/20772; H05K 7/20272; H05K 7/20254; H05K 7/20927; H05K 7/20781
See application file for complete search history.

(56) References Cited

U.S. PATENT DOCUMENTS

| | | | | |
|---|---|---|---|---|
| 9,786,578 | B2 * | 10/2017 | Cox | F28D 15/0275 |
| 2009/0225514 | A1 * | 9/2009 | Correa | H05K 7/20781 361/701 |
| 2011/0209855 | A1 * | 9/2011 | Peterson | G06F 1/20 165/104.26 |
| 2019/0077275 | A1 * | 3/2019 | Capati | H01M 10/63 |
| 2021/0127529 | A1 * | 4/2021 | Hanna | H05K 7/20772 |
| 2021/0164449 | A1 * | 6/2021 | Saavedra | F03G 6/02 |
| 2021/0378147 | A1 * | 12/2021 | Chehade | H05K 7/20927 |
| 2022/0210949 | A1 * | 6/2022 | Edmunds | H05K 7/20272 |

* cited by examiner

*Primary Examiner* — Adam B Dravininkas
(74) *Attorney, Agent, or Firm* — Compass IP Law PC

(57) ABSTRACT

An apparatus is described. The apparatus includes a cold plate. The cold plate includes an input port to receive cooled fluid. The cold plate includes an ingress manifold to feed the cooled fluid to different regions, where, each of the different regions are to be located above its own respective semiconductor chip package. The cold plate includes an egress manifold to collect warmed fluid from the different regions. The cold plate includes an output port to emit the warmed fluid from the cold plate.

16 Claims, 26 Drawing Sheets

LIQUID COOLED COLD PLATE FOR MULTIPLE SEMICONDUCTOR CHIP PACKAGES

BACKGROUND

With the onset of cloud computing, big data and other centralized high performance computing environments, system administrators are increasingly looking for new ways to pack as much functionality into as small a space as is practicable. However, increasingly difficult component integration challenges, particularly with respect to packaging and cooling, present themselves when trying to maximize functionality and minimize space consumption.

FIGURES

Figure 4A:
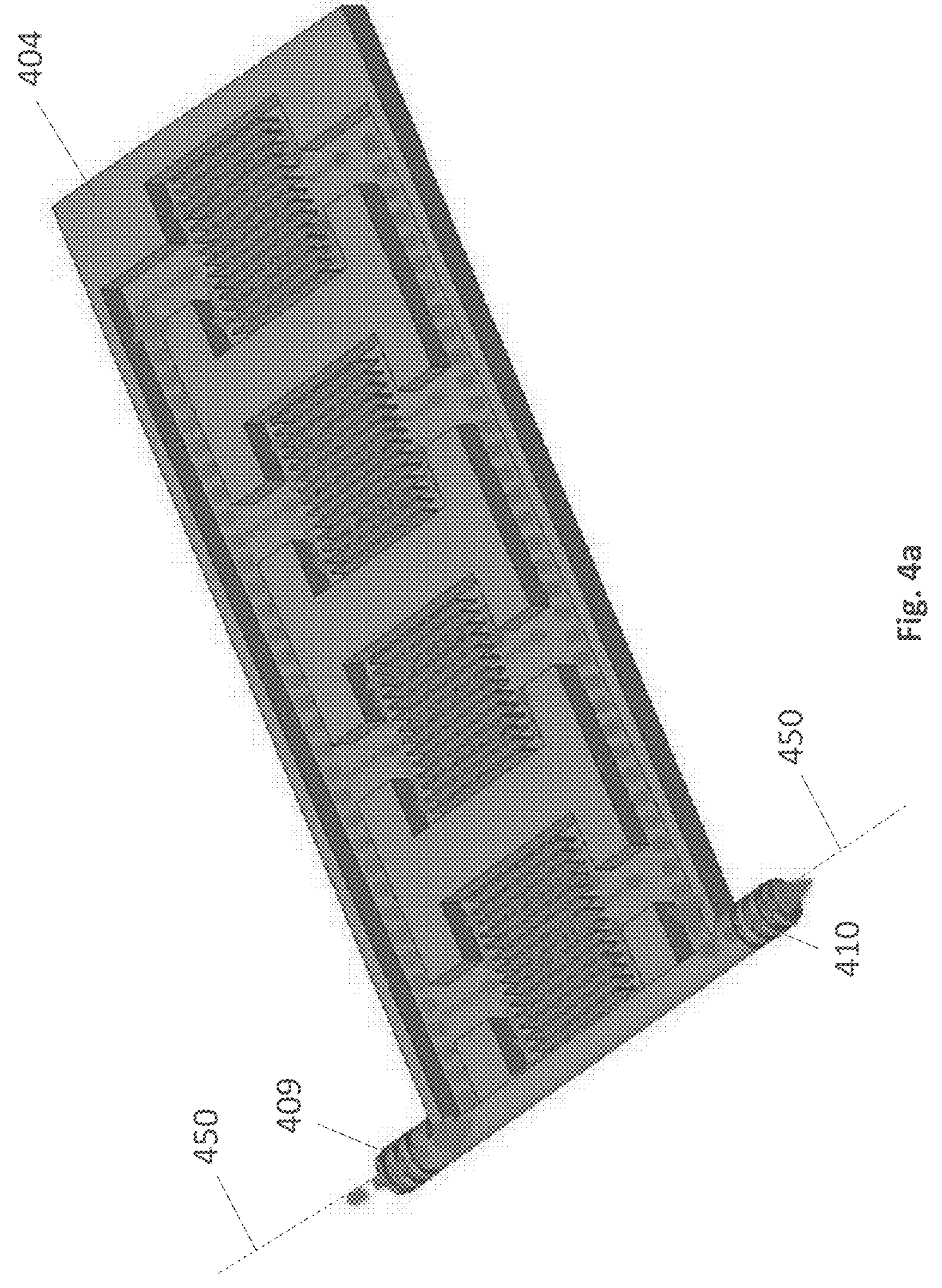
Figure 4B:
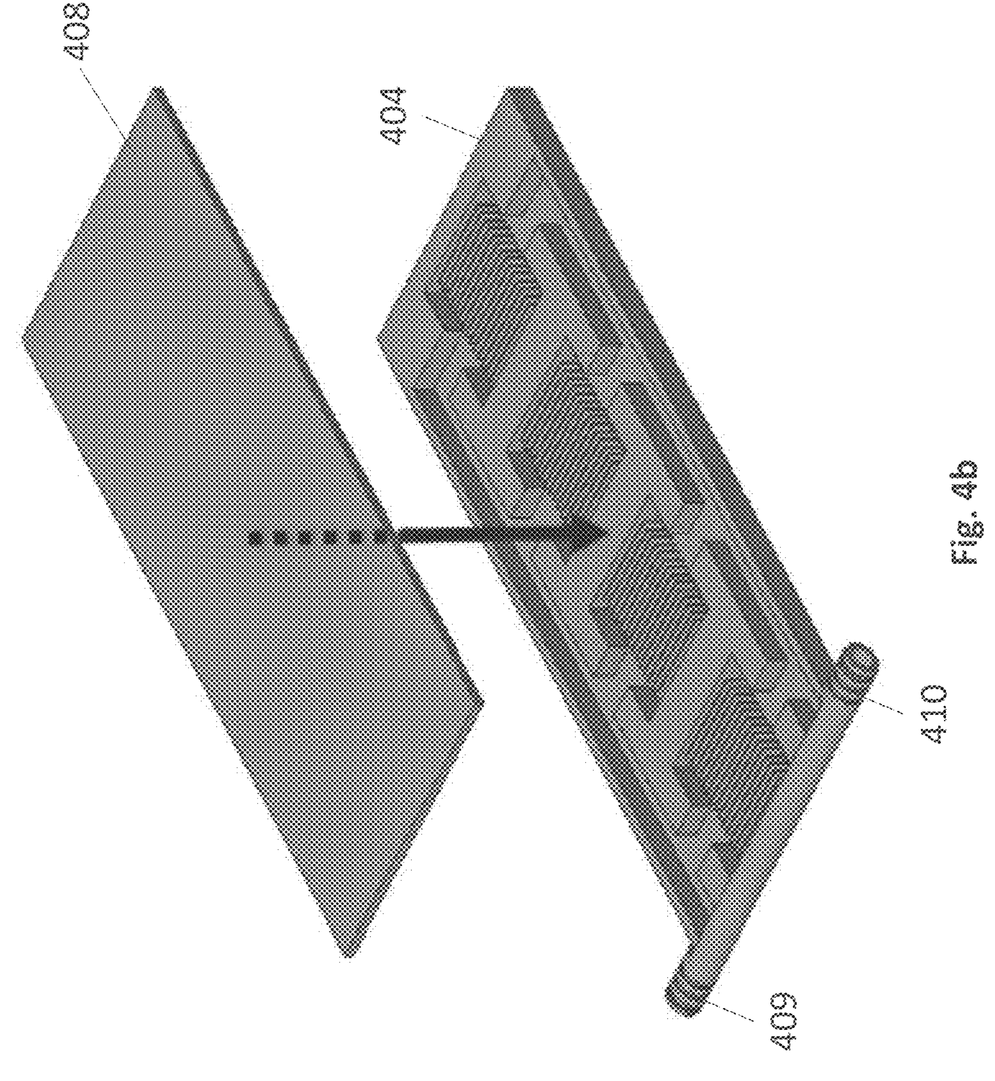
Figure 4C:
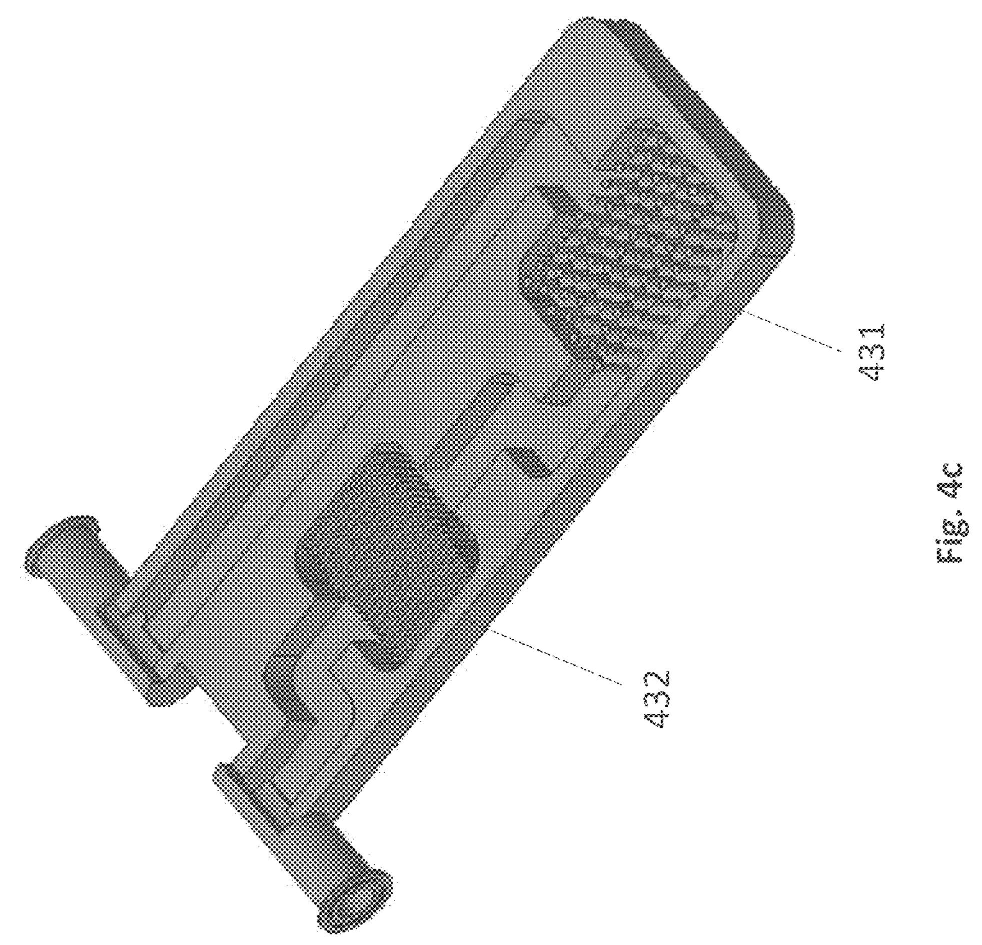
Figure 5A:
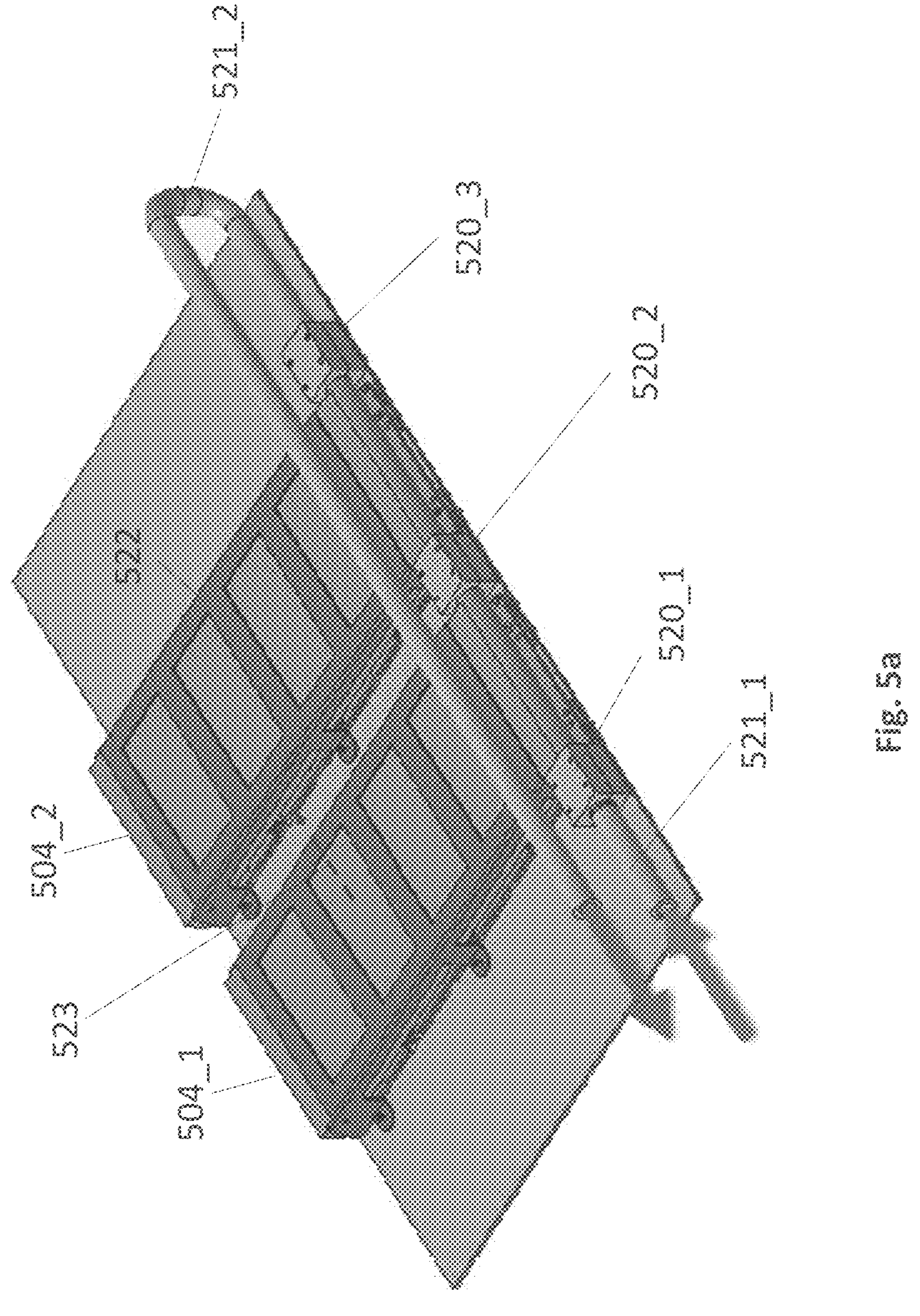
Figure 5B:
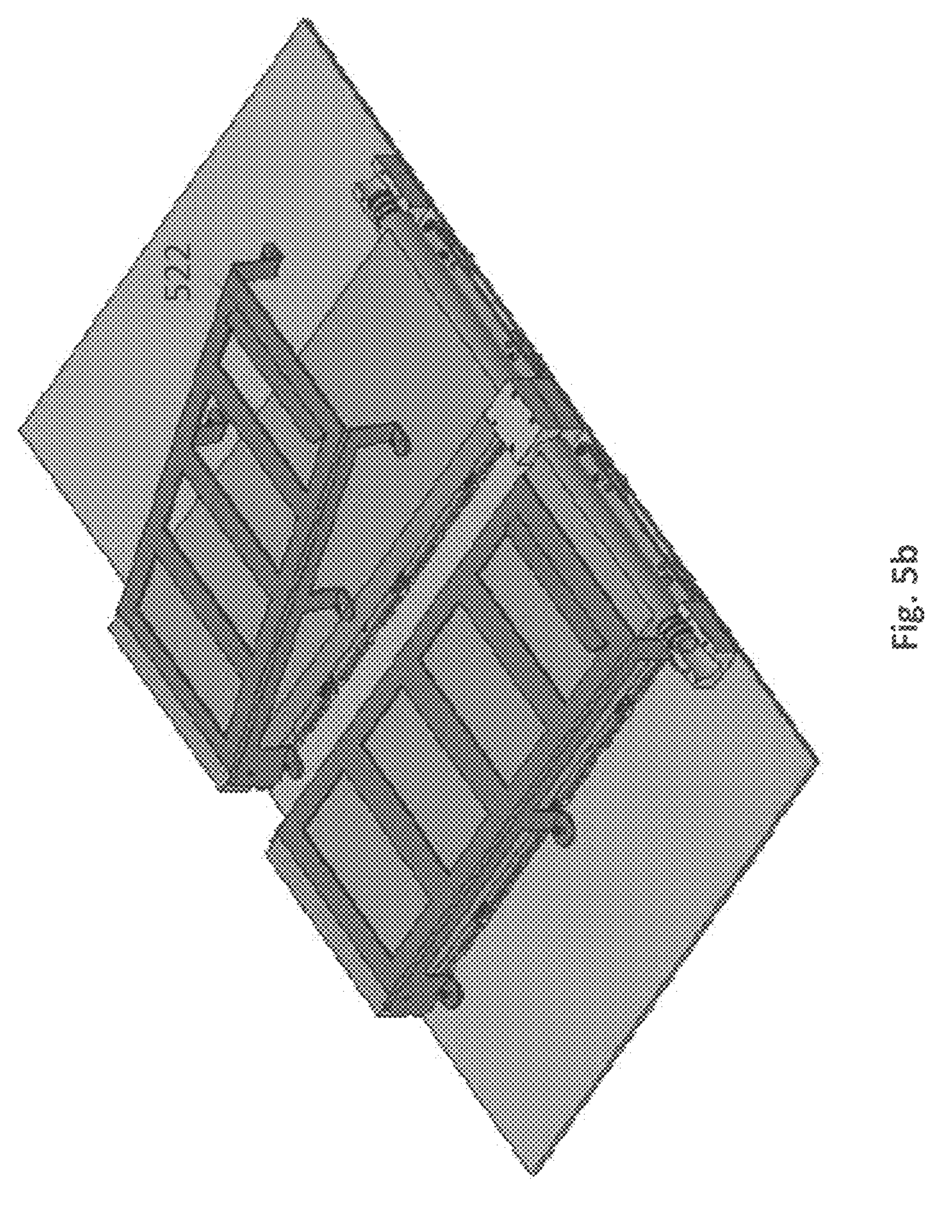
Figure 5C:
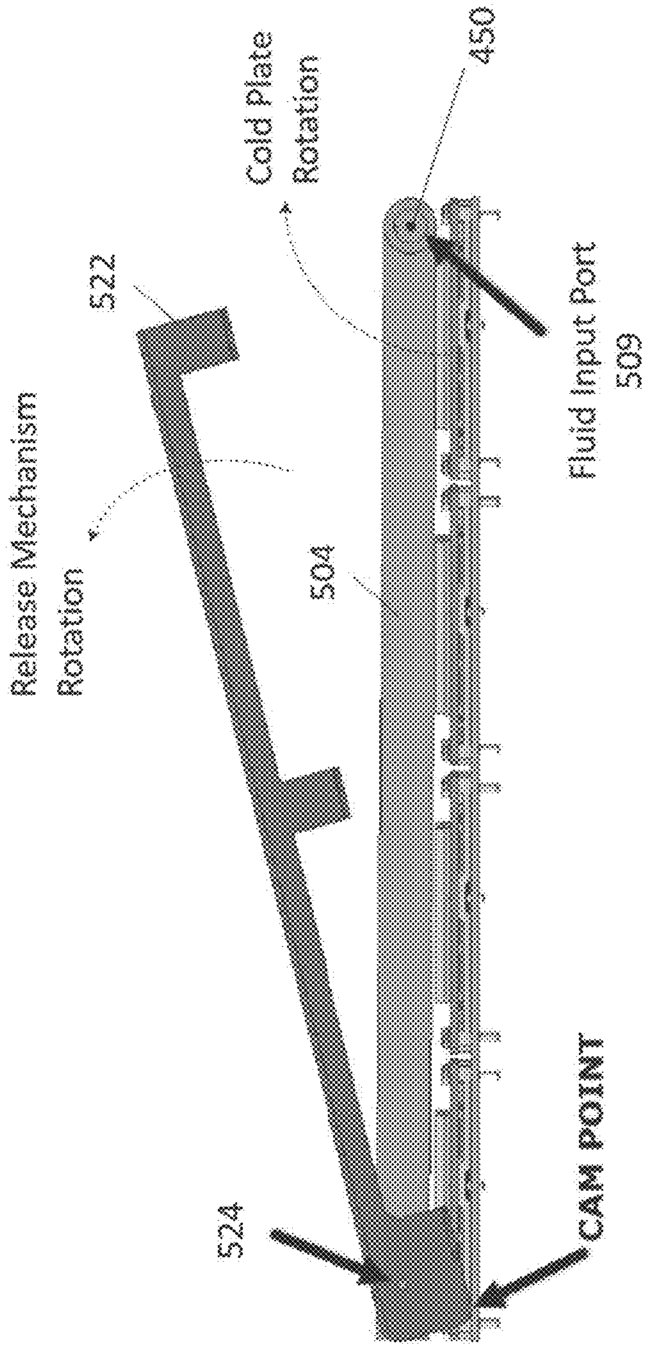
Figure 6:
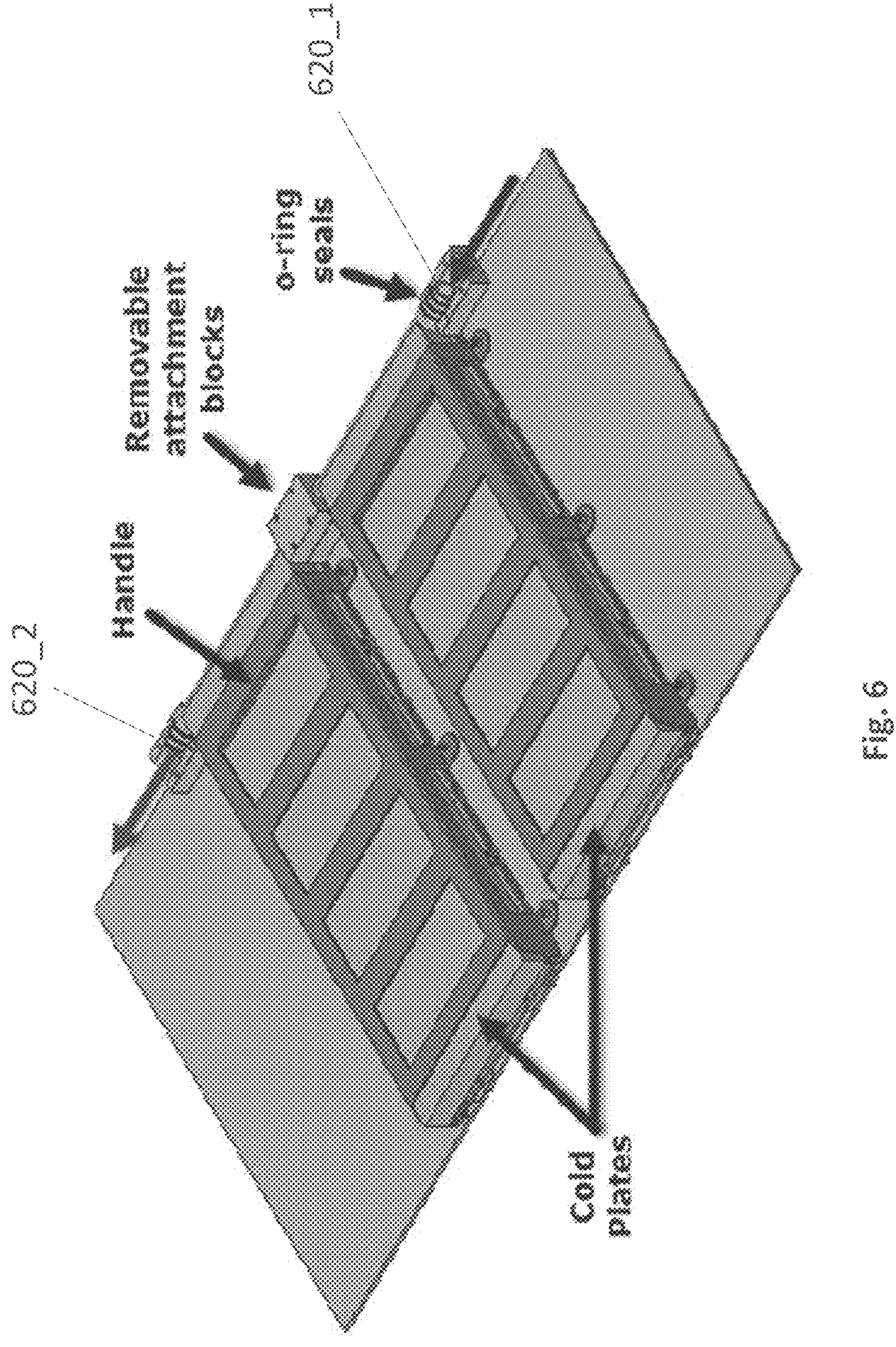
Figure 8A:
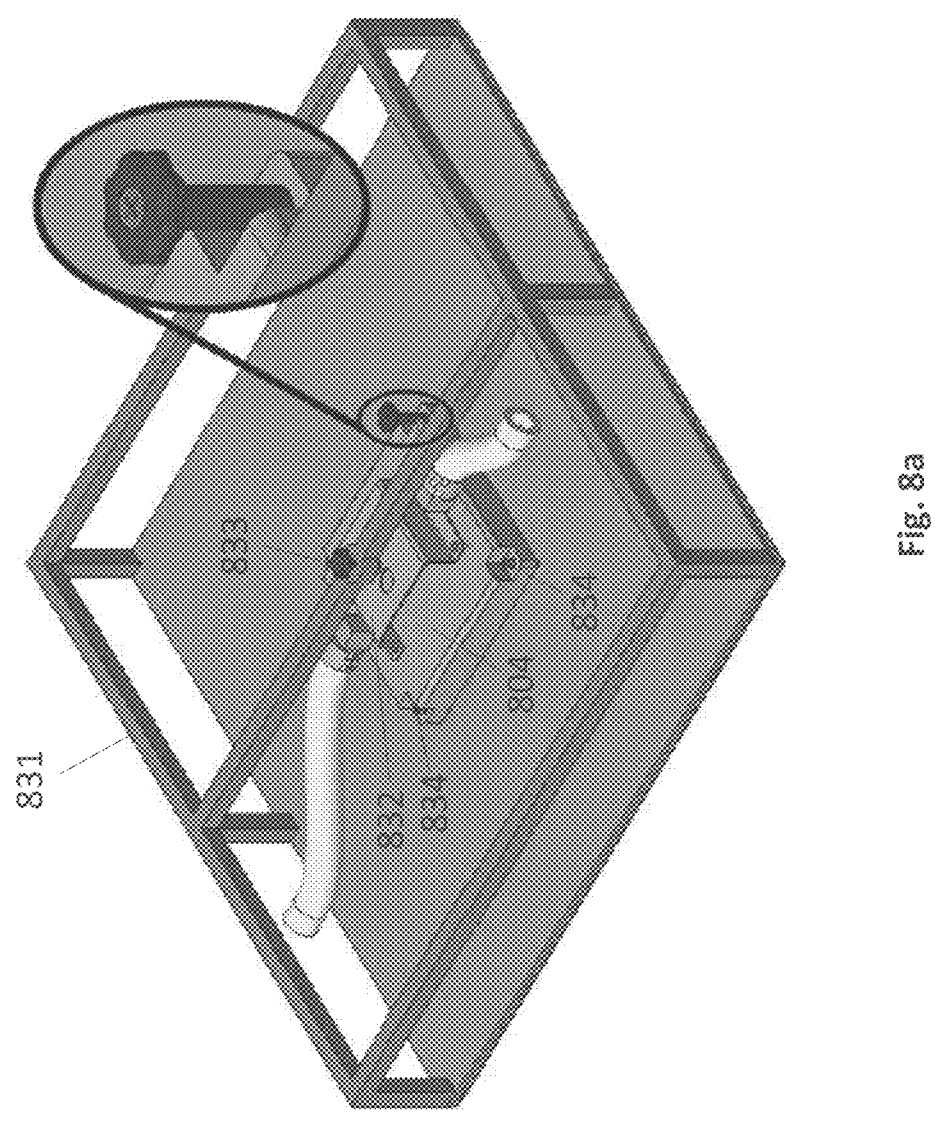
Figure 8B:
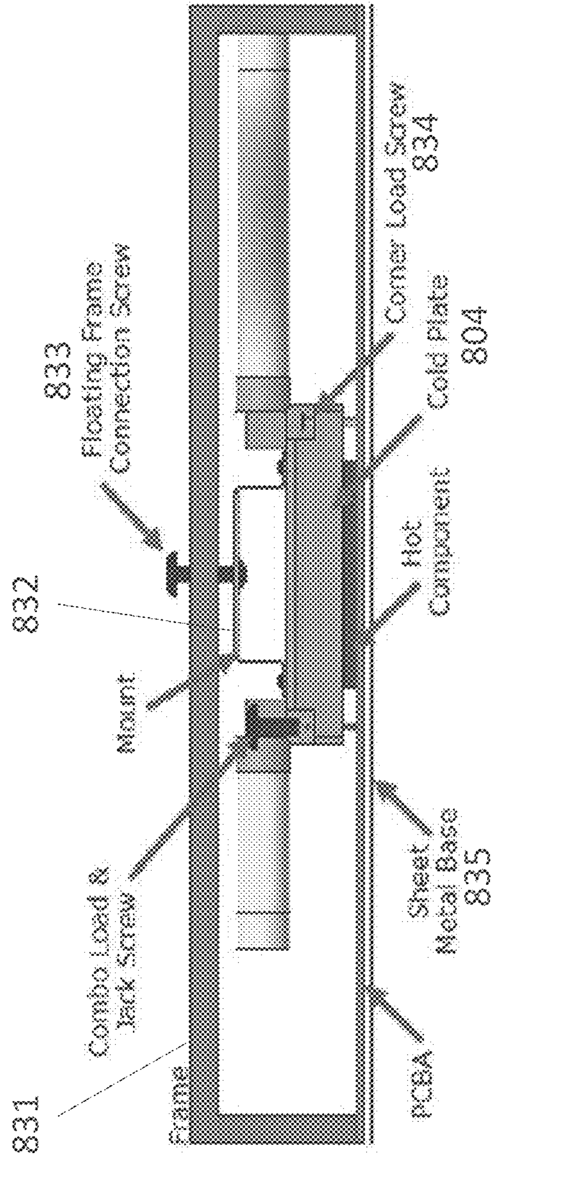
Figure 8C:
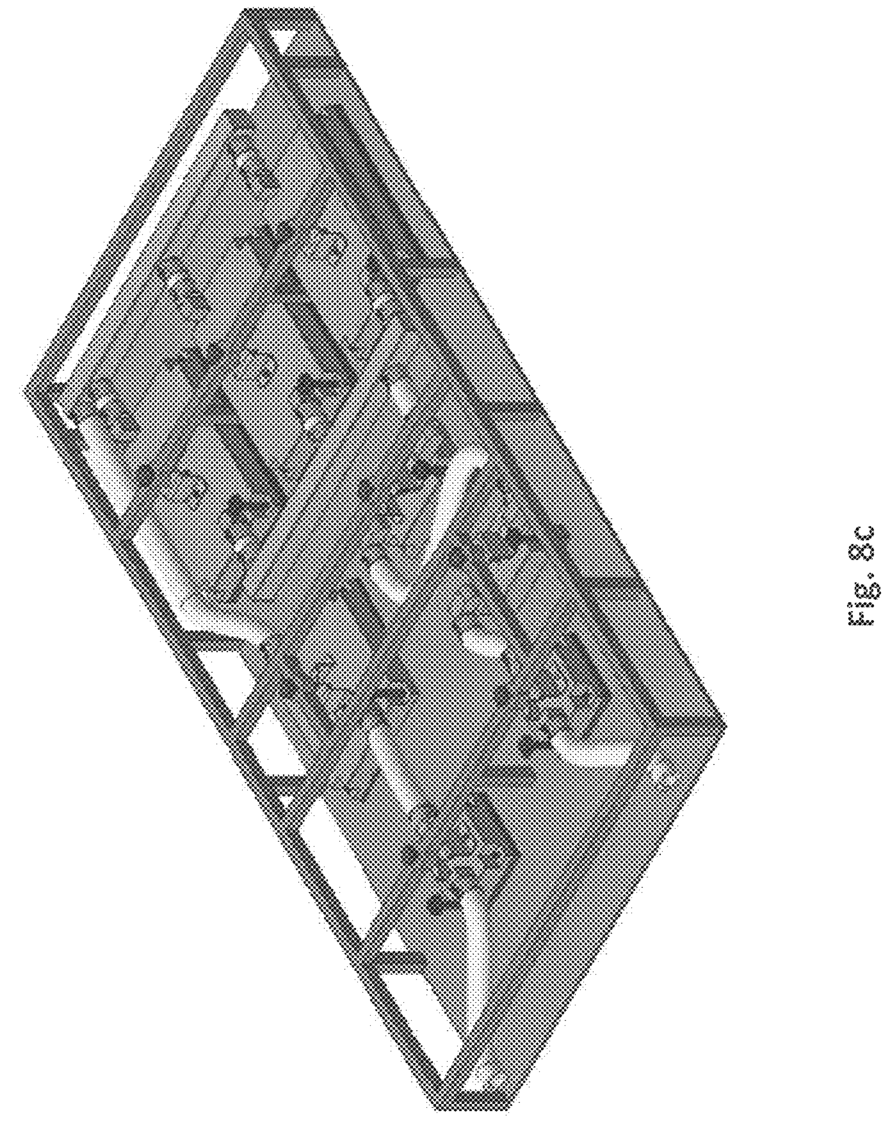
Figure 9A:
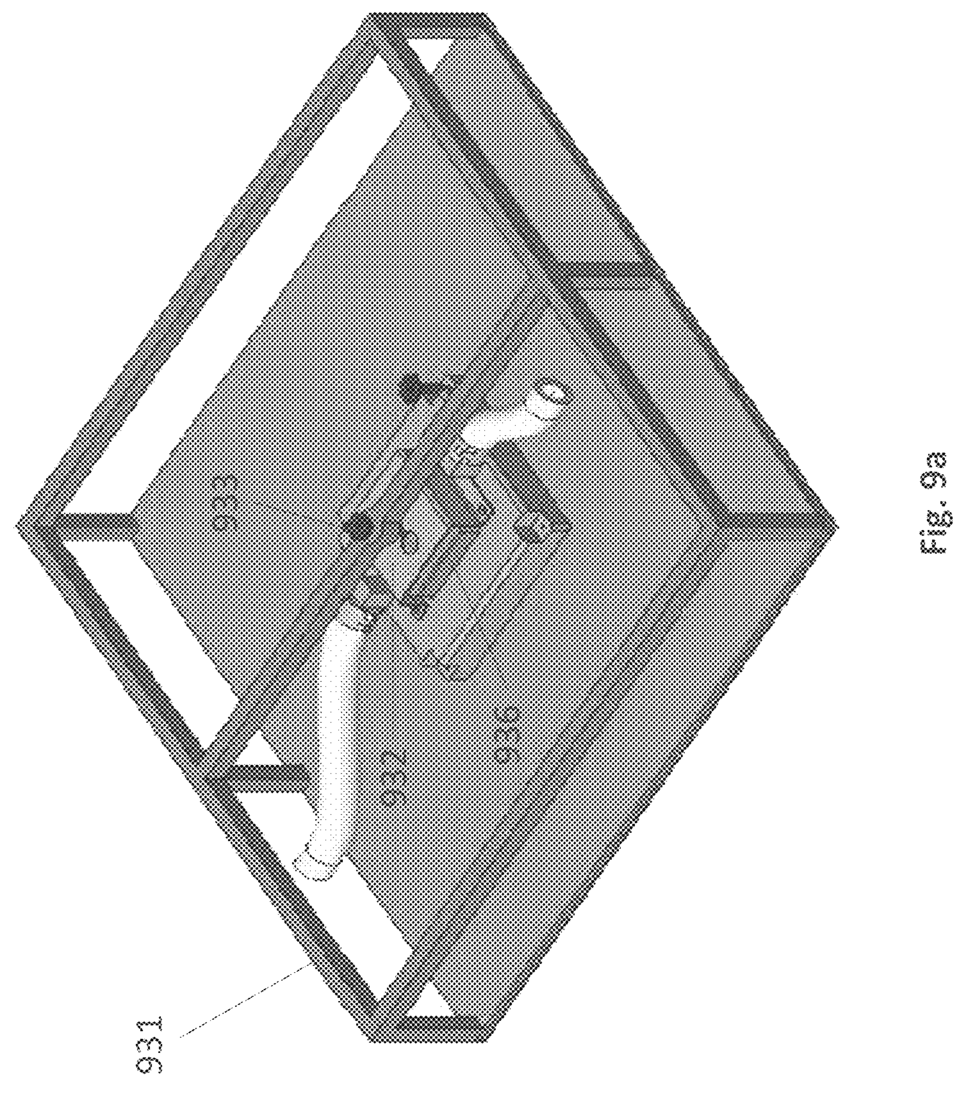
Figure 9B:
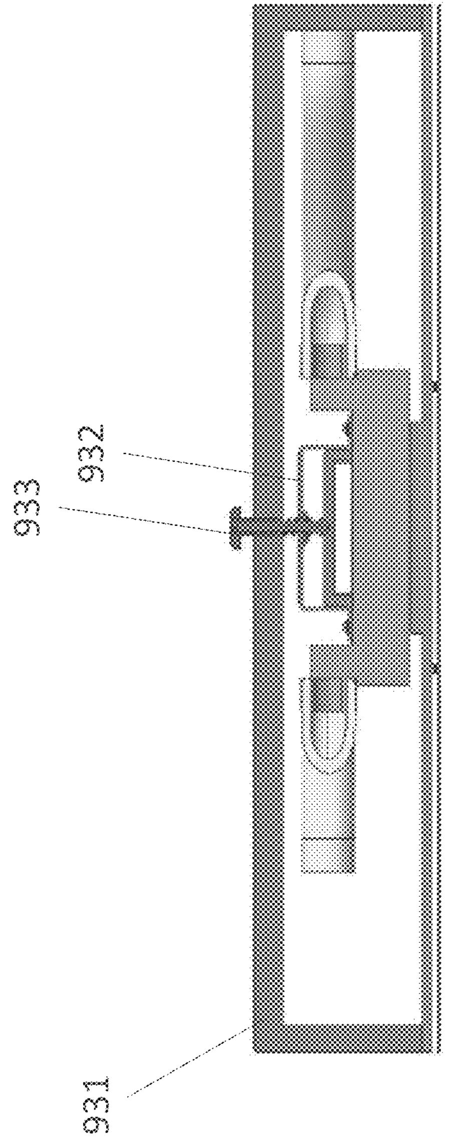
Figure 10:
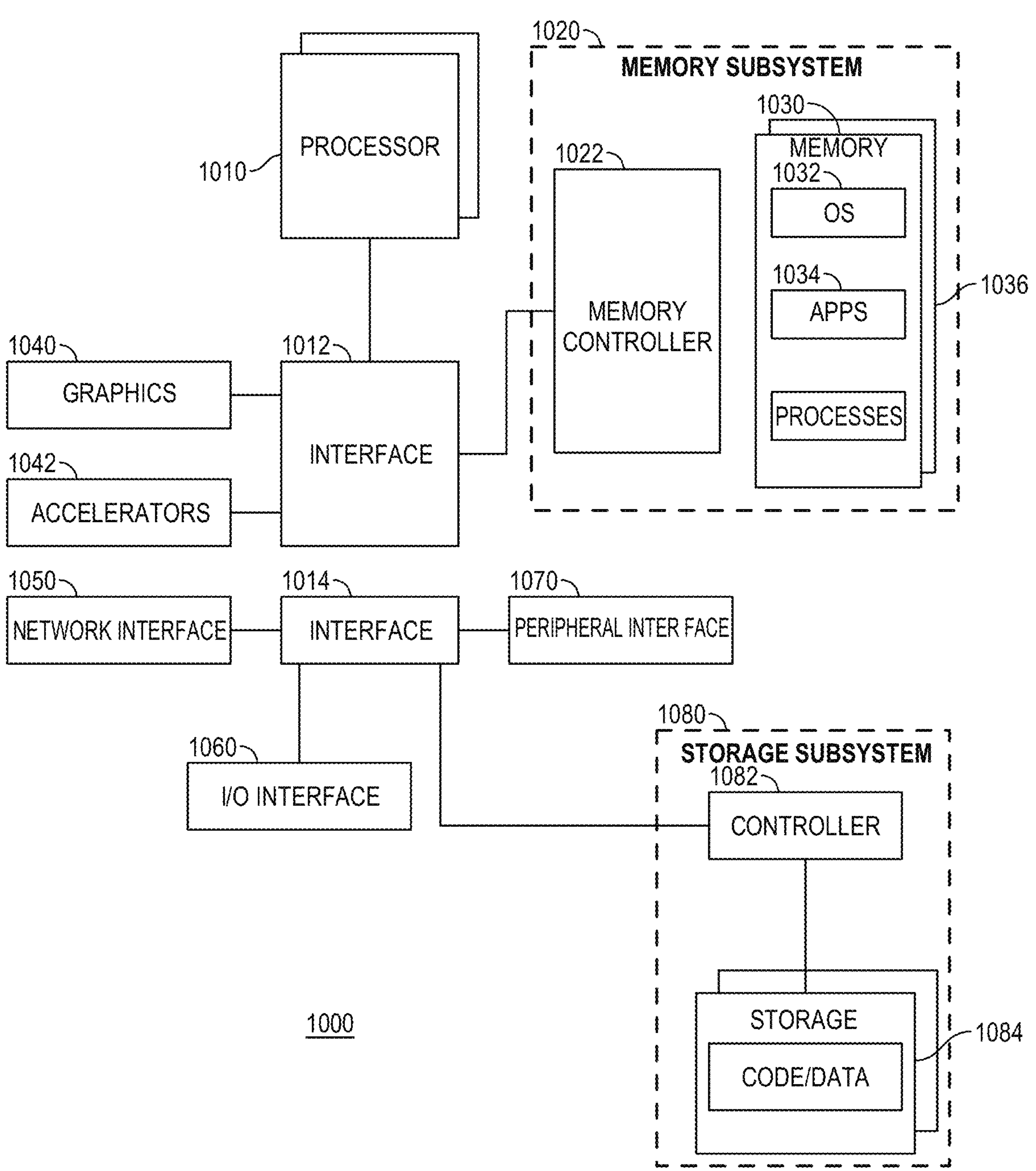
Figure 11:
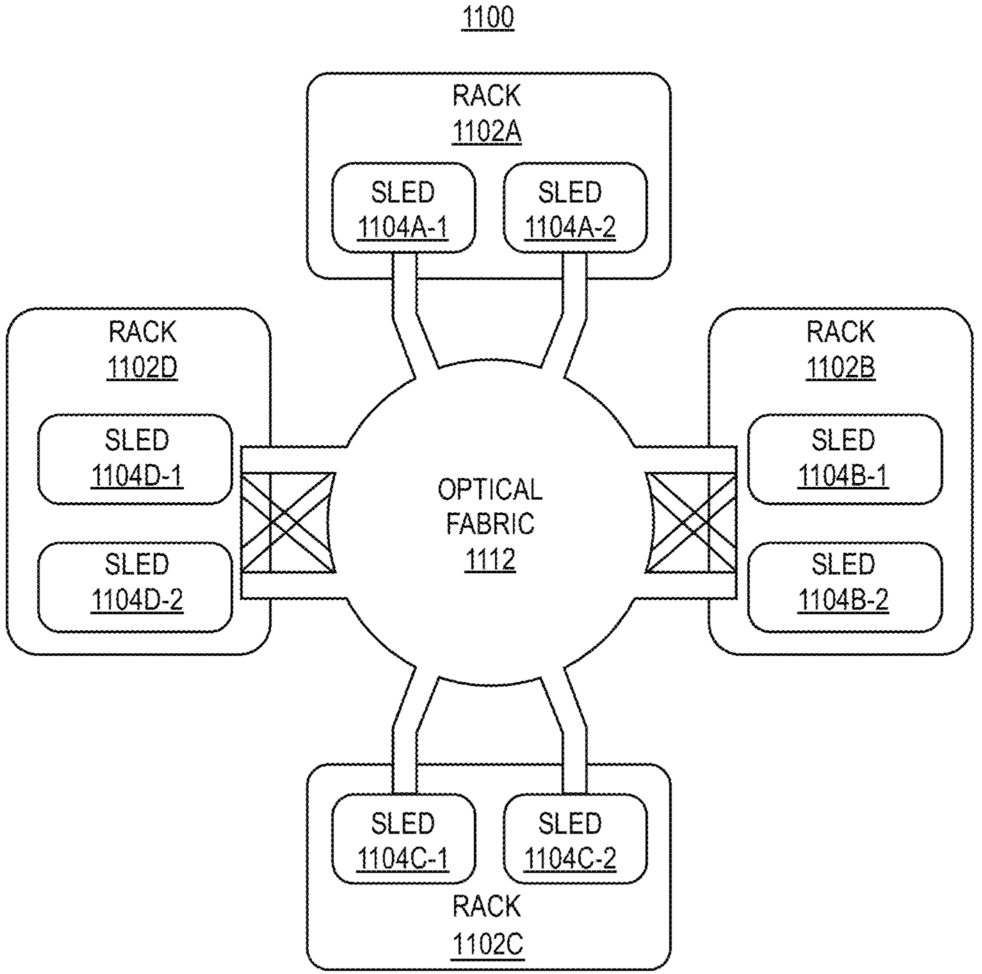
Figure 12:
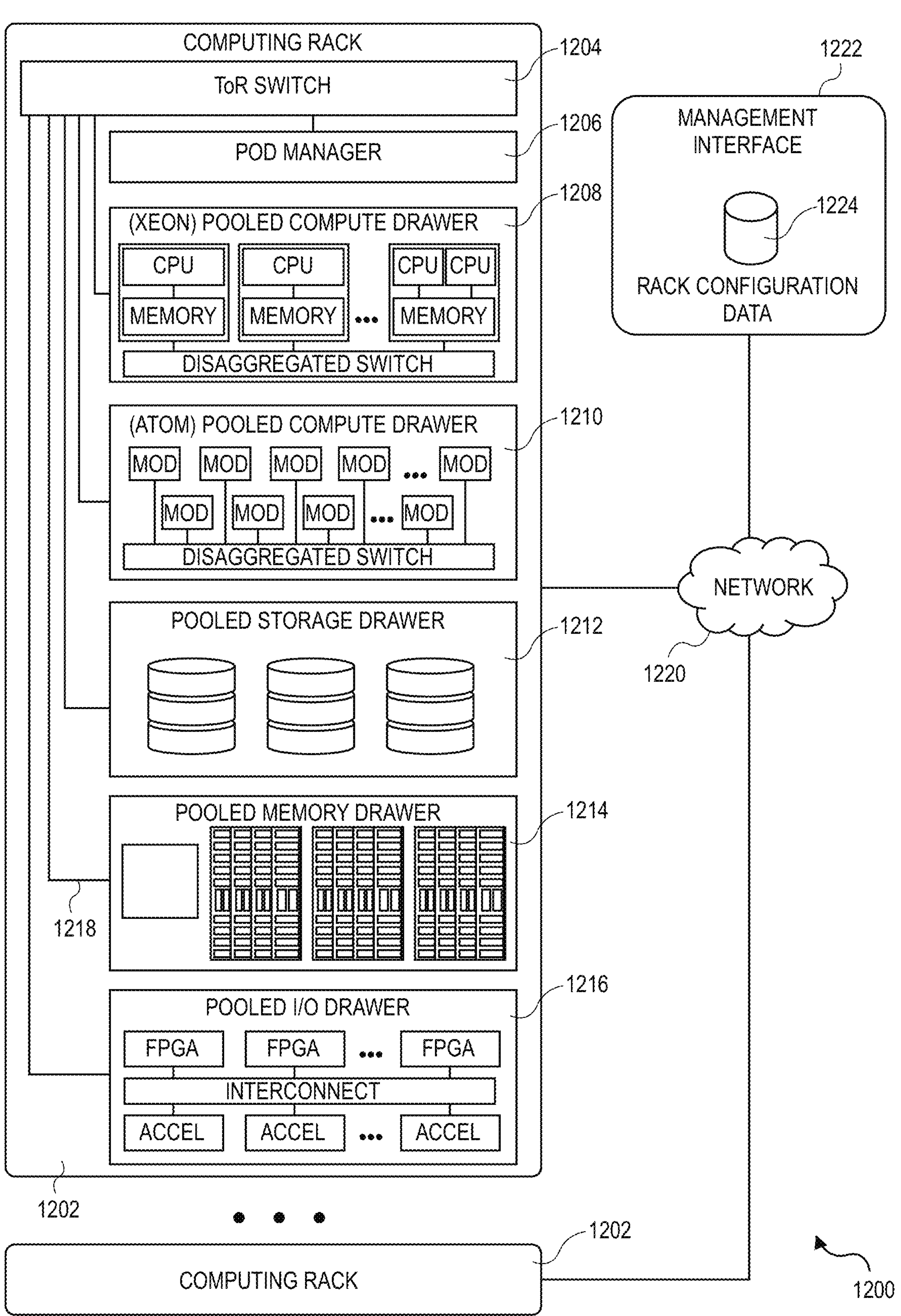

FIGS. 3*a*, 3*b*, 3*c*, 3*d* and 3*e* depict a first embodiment of an improved cold plate;

FIGS. 4*a*, 4*b* and 4*c* depict a second embodiment of an improved cold plate;

FIGS. 5*a*, 5*b* and 5*c* pertain to a release mechanism for a cold plate;

FIG. 6 shows O-ring seals in attachment blocks of a fluidic system;

FIGS. 7*a*, 7*b*, 7*c*, 7*d*, 7*e*, 7*f*, 7*g* and 7*h* pertain to a hardware element for securing a cold plate to, and then peeling the cold plate from, one or more semiconductor chip packages;

FIGS. 8*a*, 8*b* and 8*c* pertain to a first embodiment for supporting a cold plate with an outer frame;

FIGS. 9*a* and 9*b* pertain to a second embodiment for supporting a cold plate with an outer frame;

FIG. 10 depicts a system;

FIG. 11 depicts a data center;

FIG. 12 depicts a rack.

DETAILED DESCRIPTION

Figure 1:
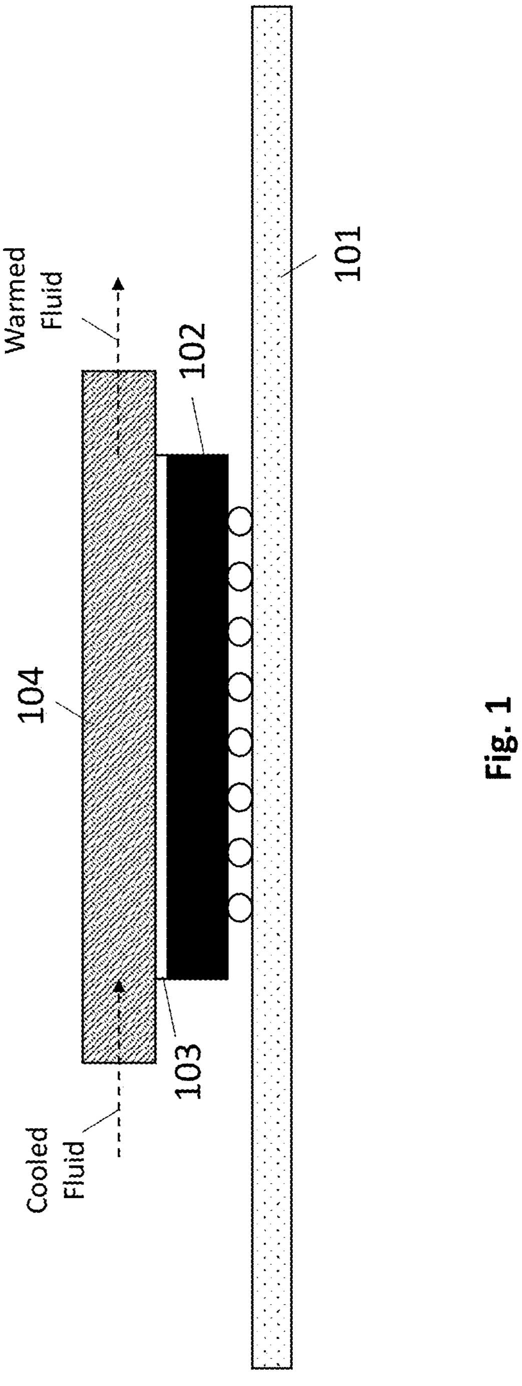
FIG. 1 shows a cold plate.

FIG. 1 depicts a liquid cooled semiconductor chip package cooling assembly which includes a cold plate 104 that is thermally coupled to the lid of a package 102 of one or more semiconductor chips. The chip package 102 is coupled to a printed circuit board 101. A thermal interface material (TIM) 103 resides between the lid of the chip package 102 and the cold plate 104 to improve thermal transfer from the chip package 102 to the cold plate 104.

The cold plate 104 includes a cooled fluid input and a warmed fluid output. As the semiconductor chip(s) operate within the package 102, heat dissipated by the chip(s) transfer through the lid of the package 102 and thermal interface material 103 into the cold plate 104. The cold plate 104 includes one or more hollow channels through which the cooled input fluid flows. As the fluid flows through the channels it absorbs heat from the cold plate 104. When the warmed fluid exits the cold plate 104, heat generated by the chip(s) within the package 102 is physically removed from the system.

Printed circuit boards having multiple chip packages that employ liquid cooling as described above can present inefficiencies if not problems when attempting to install and/or remove the individual cold plate and its associated tubing for each individual chip package that employs liquid cooling.

Here, the insertion and/or removal of any particular cold plate and its tubing consumes a certain amount of time which scales with the number of individual liquid cooled chip packages. More specifically, if there are N liquid cooled packages on a printed circuit board, the installation/removal of the liquid cooling assembly for the printed circuit board as a whole requires the insertion/removal of N cold plates and 2N tube junctions (2 tube junctions per cold plate). Thus, the time/effort associated with assembling the cooling system can be extensive.

Figure 2:
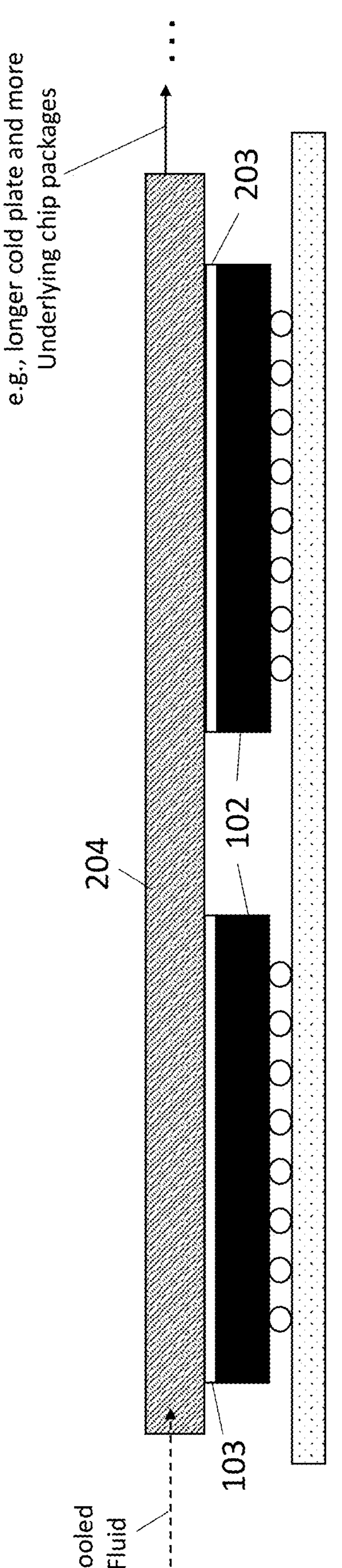
FIG. 2 shows an improved cold plate.

A solution, as observed in FIG. 2, is to create a single cold plate structure 204 that couples to the respective lids of multiple chip packages 202 ("universal monolithic cold plate", or, "monolithic cold plate"). With a single cold plate structure 204 being coupled to multiple package lids, the number of individual tubing installations/removals that need to be made by a technician are dramatically reduced.

Figure 3A:
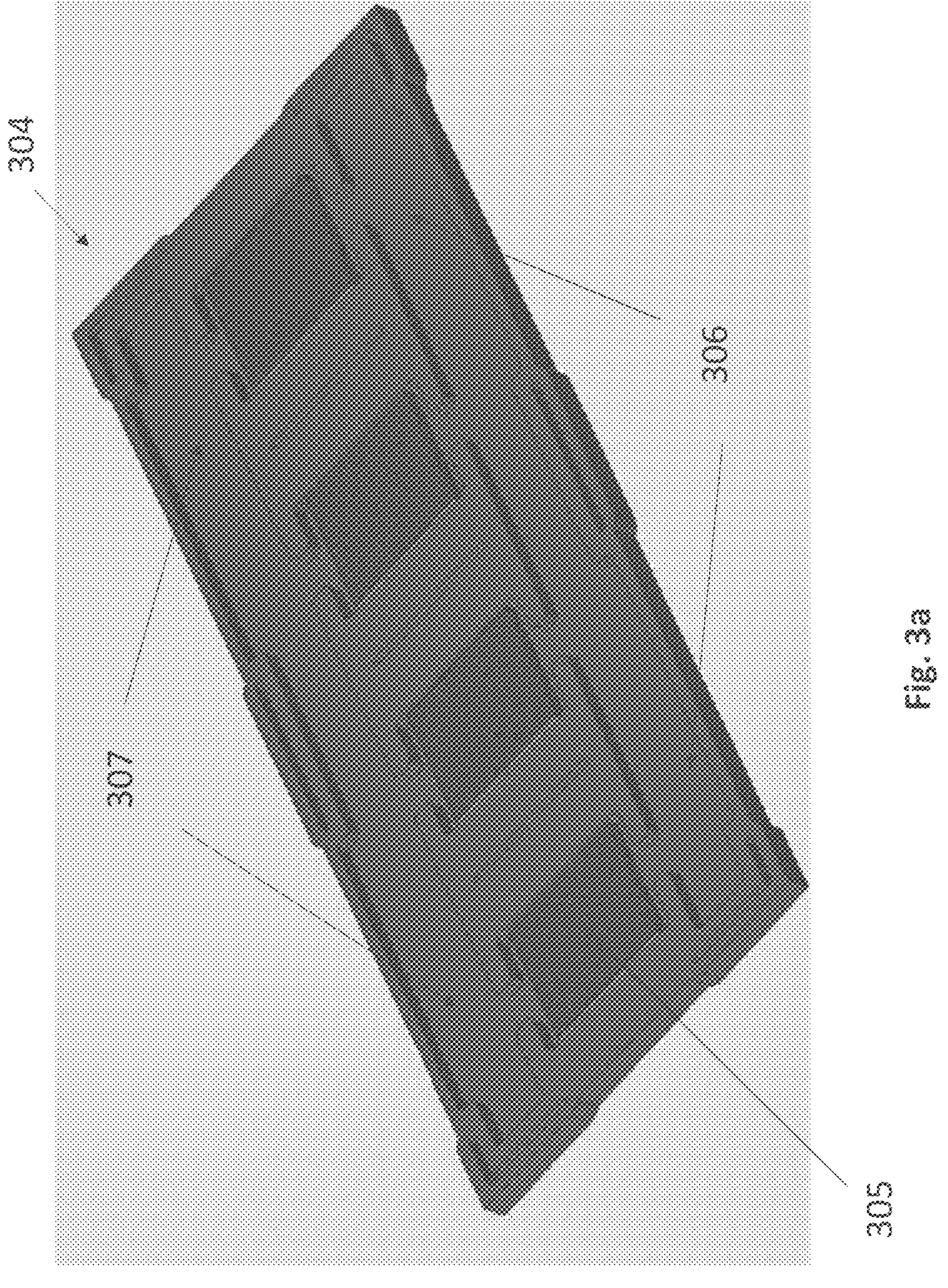
Figure 3B:
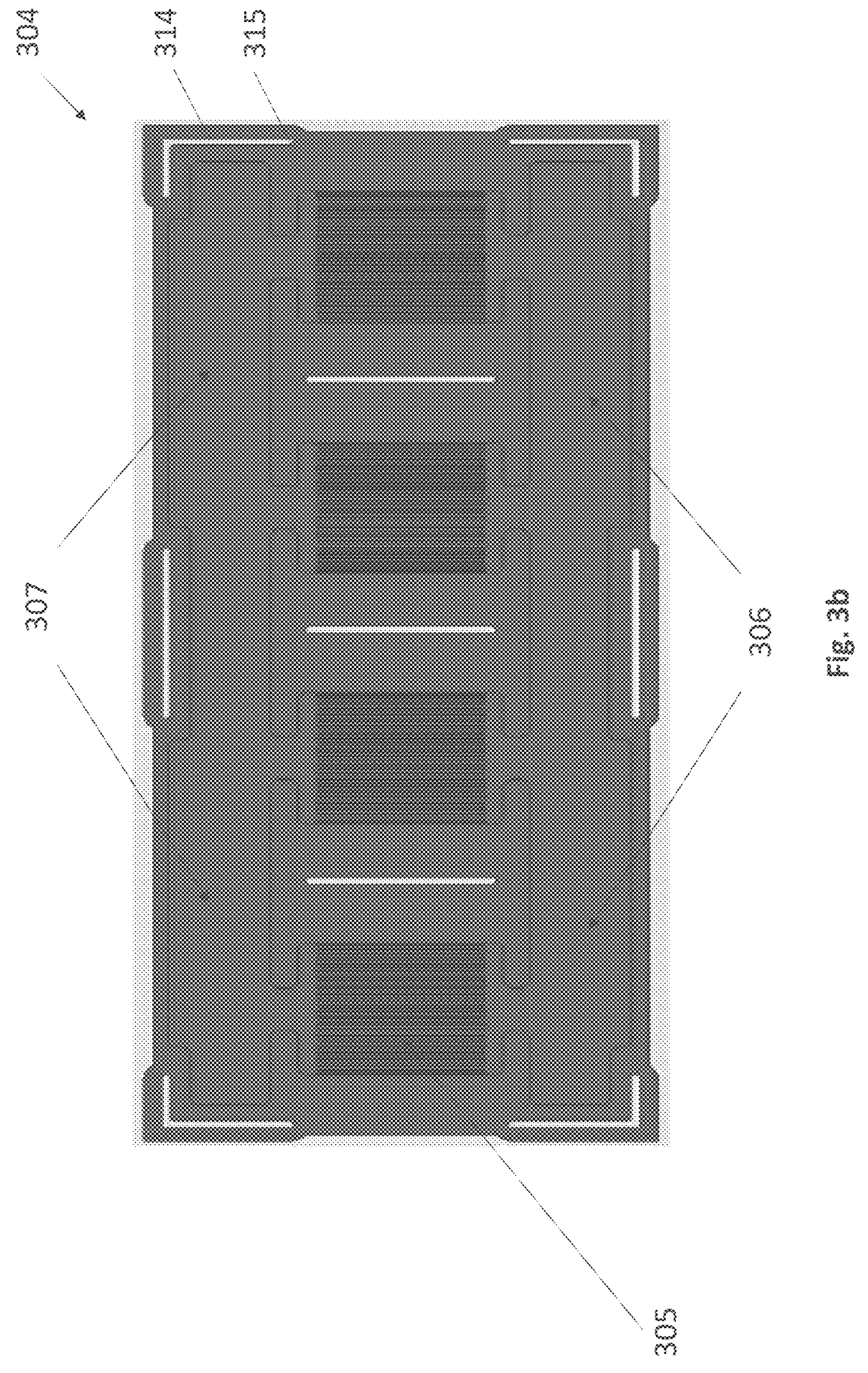

FIGS. 3*a* through 3*e* pertain to a particular monolithic cold plate embodiment 304 that is to remove the heat generated by up to four semiconductor chip packages. FIGS. 3*a* and 3*b* depict angled and top-down views of the cold plate 304 when the cold plate's cover is removed. As observed in FIGS. 3*a* and 3*b*, finned fluidic channels are formed in regions of the cold plate floor (only one 305 of the regions is labeled) that reside directly above the respective chip package lids that the cold plate will be placed upon.

The fins of the finned fluidic channels essentially increase the surface area of the cold plate floor thereby increasing the thermal transfer efficiency from the floor to the coolant in the hottest area of the floor (the area immediately above a chip package lid). The increased thermal efficiency helps transfer large amounts of heat from the chips, via their package lids and the respective regions of the floor that their package lids are in contact with (through the TIM), to the flowing coolant.

Cold fluid is injected into an input port (not shown) and enters an ingress manifold 306 that feeds the individual finned channel regions for each of the package lids. The fluid flows through the finned channel regions and absorbs heat from the underlying chip packages. The respective warmed fluidic flows from each of the finned channel regions then enter an egress manifold 307 and exit the cold plate from an exit port.

Figure 3C:
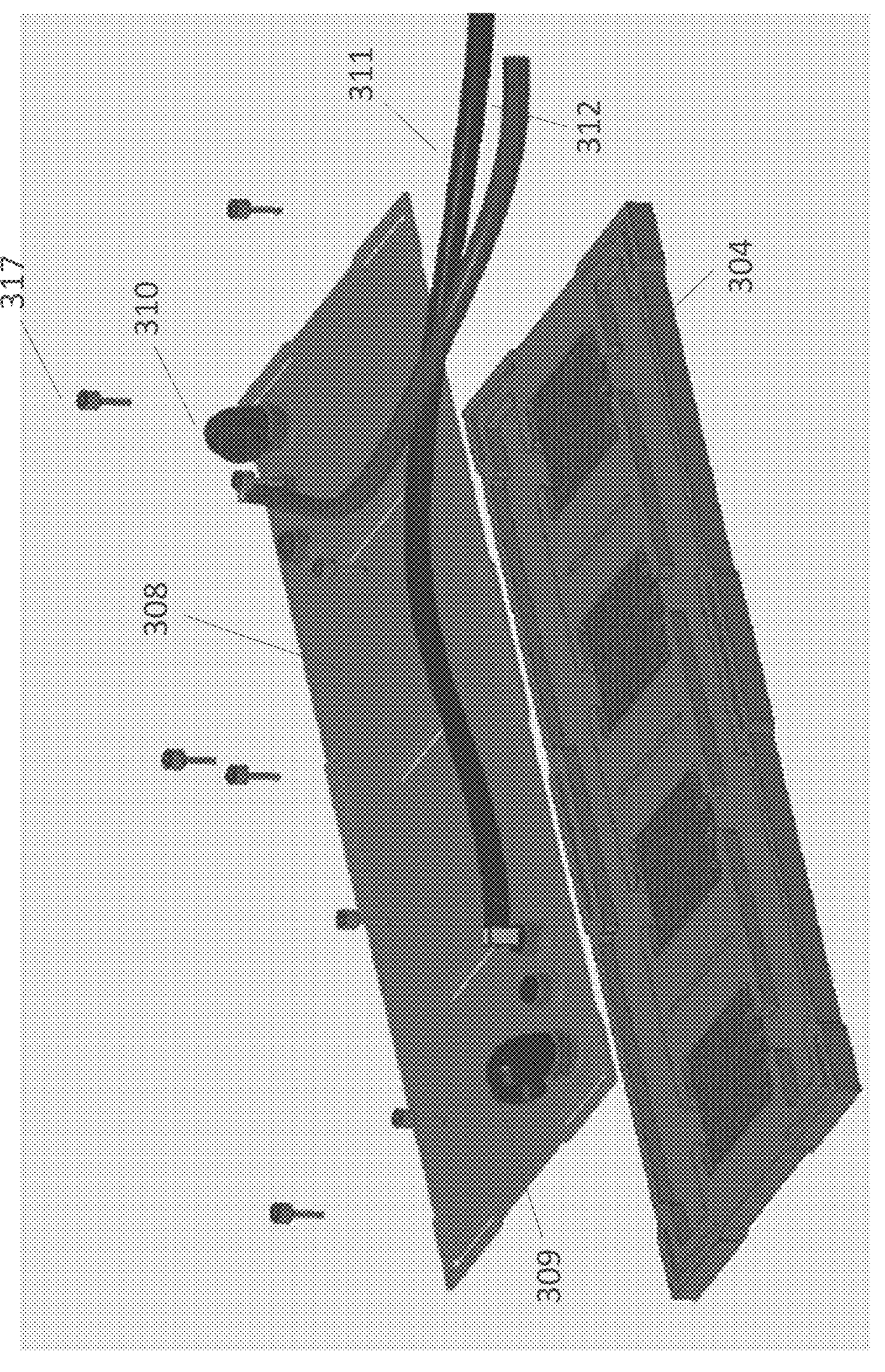
Figure 3D:
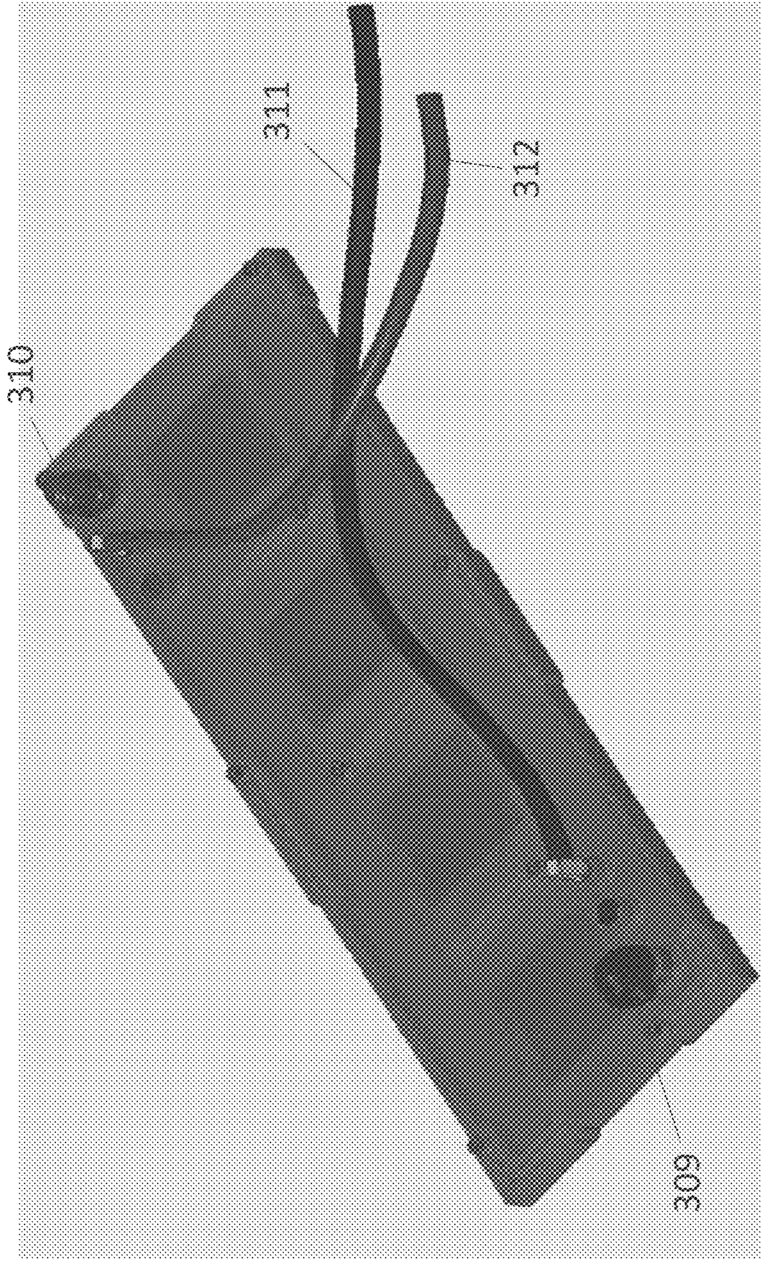
Figure 3E:
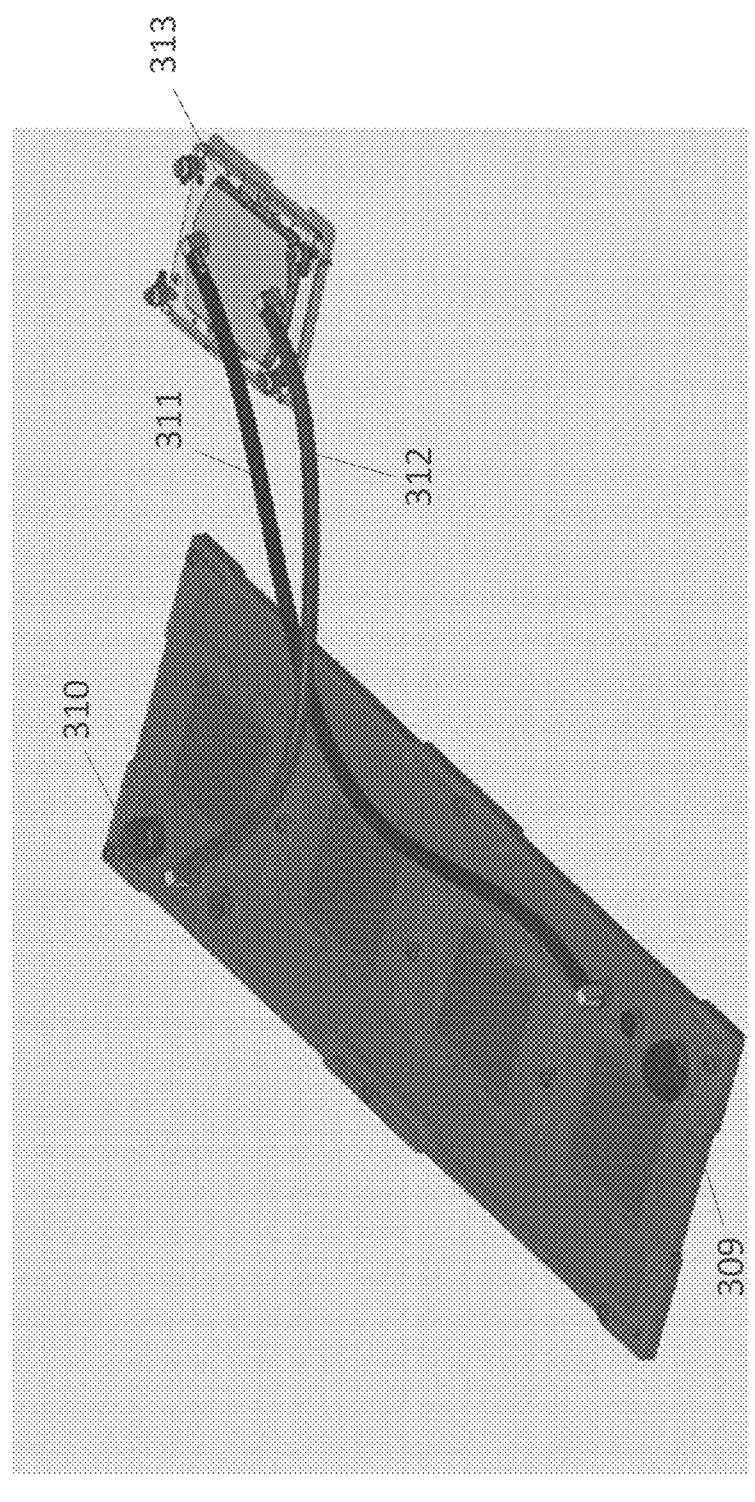

FIGS. 3*c* through 3*e* show different views of the cold plate 304 and its cover 308. As observed in FIGS. 3*c*, 3*d* and 3*e*, the input port 309 and output port 310 are located on opposite corners of the cover 308. Arranging the input and output ports 309, 310 in this manner helps force fluid flow into the ingress manifold 306 and from the egress manifold 307 as described just above. In alternate embodiments the input and output ports 309, 310 could be strategically placed near opposite sides of the cold plate 304 (as opposed to opposite corners of the cold plate) to feed fluid to the ingress manifold 307 and receive fluid from the egress manifold 308. The ingress and/or egress ports 309, 310 can also be placed on the sides or even the floor of the cold plate 304.

As observed in FIGS. 3*c* through 3*e* the cold plate 304 is also designed to include cold egress 311 and warmed ingress 312 "taps" that are used to source cooled fluid to and sink warmed fluid from a satellite cold plate 313 that cools a satellite component. Here, for example, the main cold plate 304 is designed to cool an array of high performance semiconductor chips (e.g., processors, accelerators, etc.). Commonly, other supporting circuits are located near such high performance chips that also dissipate substantial amounts of heat (e.g., voltage regulators and memory chips).

Some or all of these supporting circuits can have their own "satellite" cold plate 313, which, as observed in FIG. 3*e*, receives cooled fluid that is provided by the main cold plate 304. The warmed fluid from the satellite cold plate then received by the main cold plate 304. Notably, the cooled fluid tap 311 is near the main cold plate's ingress port 309 (to ensure the cooled tap provides cooled fluid that has just be received by the main plate) and the warmed fluid tap 312 is near the main cold plate's egress port 310 (to ensure the warmed fluid from the satellite cold plate 313 is removed from the main cold plate 304 shortly after the main cold plate receives it).

The particular cold plate 304 and cover 308 embodiment of FIGS. 3*c*, 3*d* and 3*e* also has slotted openings 314 to allow configurable mounting hardware arrangements (for ease of drawing, only one 314 of the slotted openings is labeled in FIG. 3*b*). For example, if the cold plate 304 is to mount to hardware (e.g., studs, posts, etc.) that emanates from the underlying printed circuit board, the cold plate can successfully mount to a wide arrangement of the respective locations of such hardware. For example, referring to FIG. 3*b*, a "corner" mounting stud or post could be located anywhere around corner opening 314 of the cold plate and cover from position 315 to position 316. Openings also exist to allow mounting hardware to be positioned between semiconductor chip packages (referring back to FIGS. 3*a* and 3*b*, note that the different finned channels for different respective packages are isolated from one another between the ingress and egress manifolds).

The studs, posts or other mounting hardware elements that emanate from the printed circuit board can be, e.g., an integrated component of a back plate (which is mounted to the side of the printed circuit board that is opposite that of the cold plate, and/or, a bolster plate which is a frame having opening(s) that the cold plate's underlying chip packages are located within (including any sockets that the packages are plugged into).

Here screws 317 are inserted into the slotted openings 314 in the cold plate 304 and cover 308. When the screws 317 are tightened, some percentage of the weight of the cold plate 304 is dispersed around the periphery of the cold plate through the mounting hardware rather than being borne entirely by the chip packages beneath the cold plate. Bearing the weight of the cold plate 304 on the mounting hardware rather than entirely on the chip packages helps preserve the fine pitch I/Os between the chip package(s) and their socket (s) (if any) and the printed circuit board.

FIGS. 4*a*, 4*b* and 4*c* show additional cold plate embodiments that integrate the input 409 and output 410 ports on the side of the cold plate 404 and cover 408. Additionally, as explained in more detail further below, the input 409 and output 410 ports are cylindrical and flange from the cold plate so that they not only allow for straightforward integration into a larger cooling assembly but also an axis 450 about which the cold plate pivots/rotates to allow easy peeling of the cold plate 404 from the multiple chip packages it is thermally coupled to.

Here, with increasing chip and package size, a cold plate that couples to multiple chip packages will have a large physical interface between itself and the chip packages. The large surface area combined with the paste/gel-like nature of the TIM that is inserted between the cold plate and the package lids requires a large amount of force to remove the cold plate from the underlying chip packages once that cold plate is mounted in place. For example, the (peeling) force needed to remove a single cold plate from a single chip package can be nearly 6 lbs. If the cold plate is then expanded to couple to four such chip packages, nearly 24 lbs of peeling force would be needed to remove the cold plate.

Before discussing the peeling of the cold plate, however, it is pertinent to mention that region 431 of the cold plate embodiment of FIG. 4*c* provides structure in the floor of the cold plate 504 above a chip package other than finned channels. Specifically, region 431 contains an array of posts (while region 431 contains finned channels). Here, the array of posts in region 431 can present different fluidic properties that the finned channel region 432 (e.g., less fluidic resistance, less thermal transfer efficiency) that can be suitable for various purposes (e.g., if region 431 is above a chip package that dissipates less heat than the chip package that the finned region 432 resides above).

FIGS. 5*a*, 5*b* and 5*c* depict an embodiment of a release mechanism 519 and the rotational peeling of a cold plate from its underlying chip packages.

FIG. 5*a* shows a pair of cold plates 504_1, 504_2 after they have been mounted to their respective chip package lids. More specifically, the cold plates 504_1, 504_2 have been mounted to mounting hardware (not shown), e.g., that emanates from the printed circuit board, and, have been assembled into a fluidic system.

As observed in FIG. 5*a*, the fluidic system is constructed by piecing together building block components such as the cold plates 504_1, 504_2, attachment blocks 520_1, 520_2, 520_3 and tubing 521_1, 521_2. A primary cold fluid flow enters at fluidic input 521_1. From the input, the fluid flows through a first attachment block 520_1 and enters the input port of the first cold plate 504_1. The fluid is warmed as it flows through the first cold plate 504_1 and exits from the first cold plate's exit port. The semi-warmed fluid then flows another attachment block 520_2 and enters the input port of the second cold plate 504_2. The fluid is warmed further and exits the second cold plate 504_2. The fluid then flows through a third attachment block 520_3 and flows through the return warm fluidic tubing 521_2.

If the second cold plate 504_2 is to be removed from its chip package lids, a technician untightens the second cold plate 504_2 from its respective mounting hardware and engages the release mechanism 522. The release mechanism 522 is engaged by lifting the edge of the release mechanism 522 nearest the cold plate's input/output ports as observed in FIG. 5*b*. Note that fluid can remain flowing through the system unless the second cold plate 504_2 is to be physically removed from the fluidic system (physically removing the cold plate 504_2 from the chip package lids is different than removing the cold plate 504_2 from the fluidic system).

FIG. 5*c* shows a side view of the release mechanism as observed along ray 523 of FIG. 5*a*. As observed in FIG. 5*c*, the lifting of the lever arm of the release mechanism 522 causes the mechanism to rotate about an axis 524 that is at the far end of the cold plate 504 (away from the cold plate's fluid input port 409). Importantly, a pivot axis 524 and cam is formed in the shape of the release mechanism near and end of the level arm opposite from the end of the lever arm that is lifted. As such, when the technician lifts the lever arm of the release mechanism 522, a significant torque (effected by the length of the lever arm) is applied about the pivot axis 524 thereby causing the cam to rotate. When the cam rotates the cold plate 504 is lifted at its far end as it rotates about the axis 450 centered through the fluidic input port 509. As such, the cold plate's rotation affectively peels the cold plate 504 off the chip package lids starting at the far end.

Here, the lever arm of the release mechanism 522 converts minimal force applied by the technician to a large rotational torque that easily overcomes the force needed to peel the cold plate 504 from its underlying chip packages. Once the cold plate 504 is initially peeled off by the cam of the release mechanism 522, the technician can easily rotate the cold plate 504 further to fully peel the cold plate off its chip package lids.

FIG. 6 shows the system of FIG. 5*a* but with the tops of two of the attachment blocks 620_1, 620_2 removed. As observed, inside the attachment blocks are a series of O-ring seals that prevent leaks in the fluidic system while allowing the cold plates to rotate. In essence, the attachment blocks are extended clamps with internal O-ring seals.

In combination with any of the embodiments described above (or in other embodiments), a combo load and jack screw, as described with respect to FIGS. 7*a* through 7*h*, can be used to mount a cold plate to its attachment hardware.

Figure 7C:
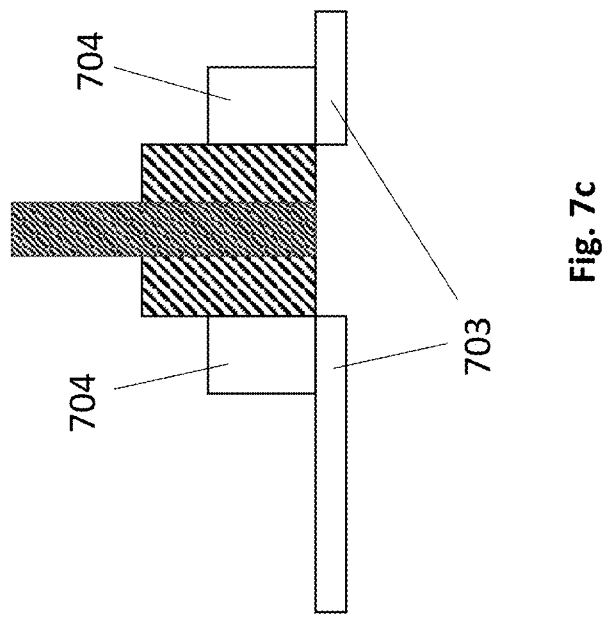
Figure 7B:
Figure 7A:
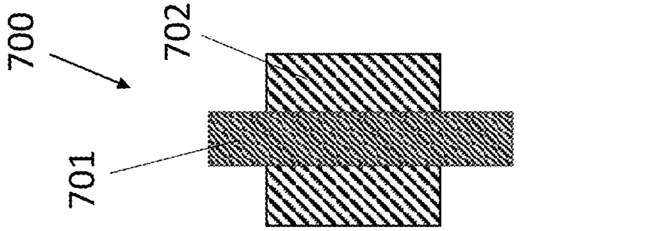

FIG. 7*a* shows a side view of a combo load and jack screw 700. As observed in FIG. 7*a*, the combo load and jack screw includes an inner load screw 701 and an outer jack screw 702. Before the screw is mounted to the cold plate, as observed in FIG. 7*b*, the inner load screw 701 is turned in an untightening direction so that, e.g., it reaches a maximum height within the outer jack screw 702.

As observed in FIG. 7*c*, the combo screw is then attached to the cold plate 703 by threading the outer jack screw 702 into housing 704 such that the bottom of the outer jack screw 702 does not emerge from beneath the bottom of the cold plate 703 (the housing 704 is an integrated feature of the cold plate 703). In various embodiments, additional hardware associated with housing 704 and/or outer jack screw 702 are designed to prevent the outer jack screw 702 from emerging from the bottom of the cold plate 703 while ensuring that the outer jack screw 702 is sufficiently threaded into the housing 704.

For example, a sleeve (not shown) having a height that is higher than the housing 704 may be placed around the housing 704. When the outer jack screw 702 is tightened into the housing 704, the pan head of the outer jack screw (also not shown) presses against the top of the sleeve thereby acting as a stop for the outer jack screw 702 and setting its threaded depth into the housing 704.

Figure 7E:
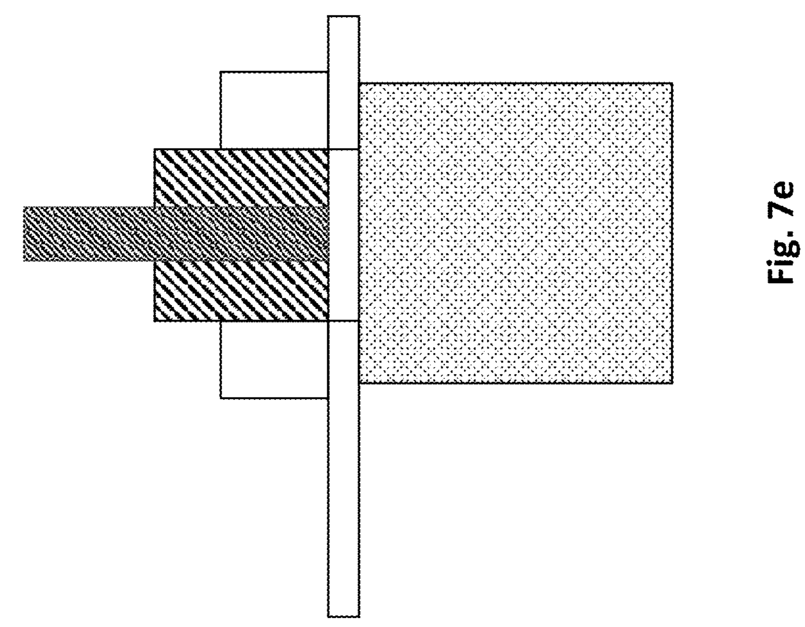
Figure 7D:
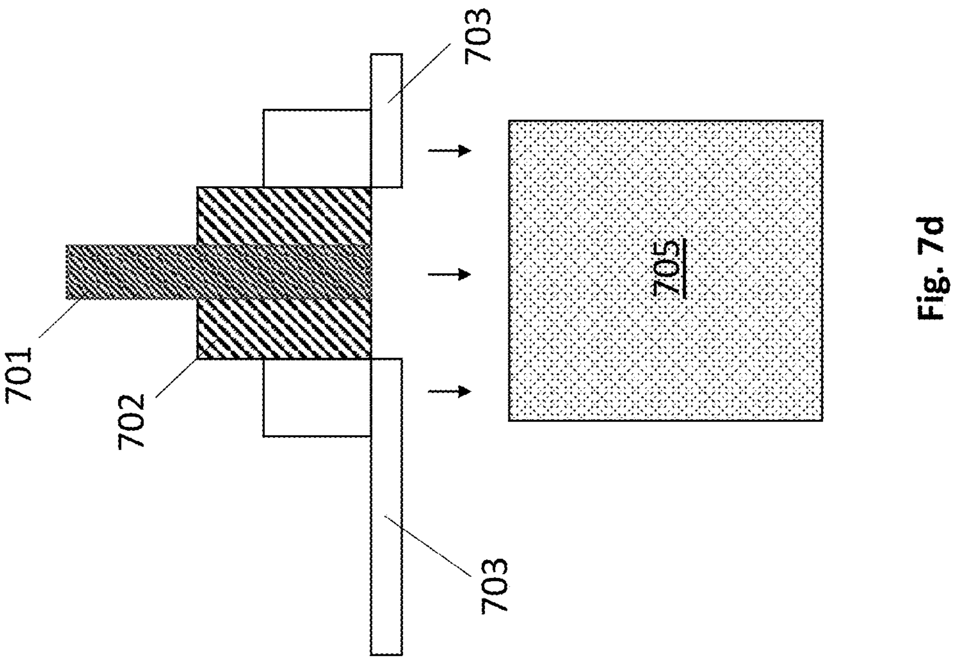

After the outer jack screw 702 has been threaded into the housing 704, as observed in FIGS. 7*d* and 7*e*, the cold plate 703 is placed upon the mounting hardware 705 that emanates from the printed circuit board. Once the cold plate 703 has been placed on the mounting hardware 705, as observed in FIG. 7*f*, the inner load screw 701 is threaded into holes in the hardware 705 (which has a threaded opening to receive the inner load screw). The aforementioned sleeve, e.g., prevents rotation of the outer jack screw 702 while the inner load screw 701 is being tightened into the hardware.

In further embodiments, the inner load screw 701 is spring loaded so that increased tightening of the load screw 701 expands a spring element (e.g., coil spring, metal finger, leaf spring, etc.) that increases a compressive force that compresses the cold plate 703 against the mounting hardware 705. In this state the cold plate 703 is secured against the mounting hardware 705. More specifically, the cold plate 703 is pressing into the lid(s) of the chip package(s) beneath the cold plate 703 (which ensures good thermal transfer efficiency between the package lids and the cold plate) while the weight of the cold plate 703 is largely borne by the mounting hardware 705 rather than the chip packages. The semiconductor chips that the cold plate cools can then operate until a technician decides to remove the cold plate 703.

Figure 7G:
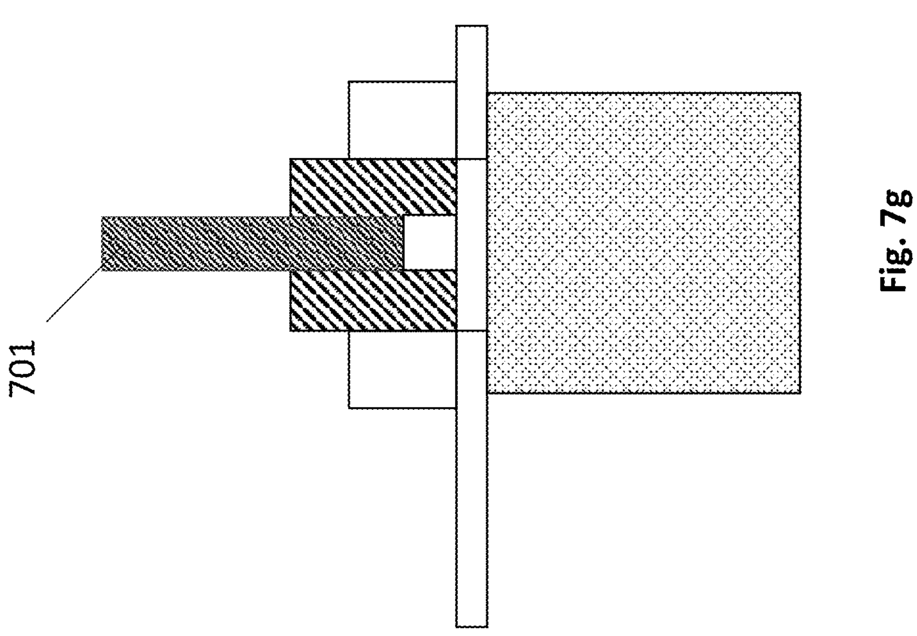
Figure 7F:
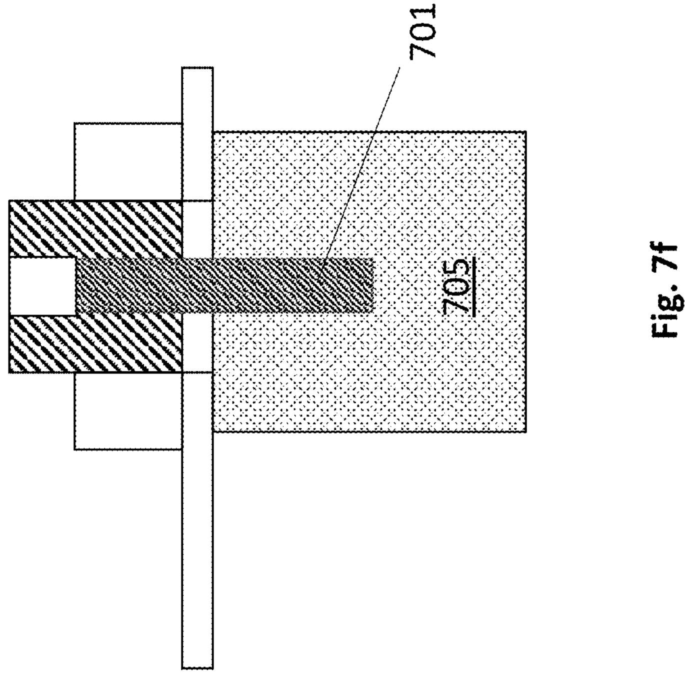
Figure 7H:
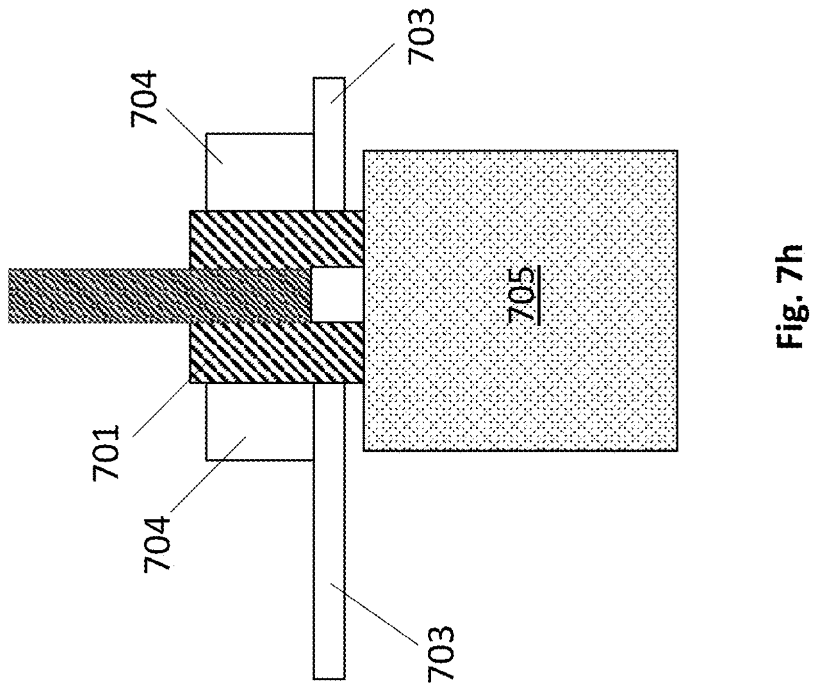

To remove the cold plate, as observed in FIG. 7*g*, the inner load spring 701 is untightened so that it releases from (is no longer threaded into) the mounting hardware 705. The stopping mechanism for the outer jack screw 702 (e.g., the aforementioned sleeve) is then removed or otherwise disengaged which allows the jack screw 702 to emerge from the bottom of the cold plate 703 when threaded deeper into housing 704 as observed in FIG. 7*h*. With the outer jack screw 702 emerging from the bottom of the cold plate 703, the bottom of the outer jack screw 702 presses upon the mounting hardware 705 thereby lifting/peeling the cold plate 703 off the lid(s) of the chip package(s).

As discussed above, the existence of a gel or paste-like TIM between the cold plate 703 and package lids makes it more difficult for a technician to remove the cold plate from the chip package lids. With the outer jack screw 702 pressing into the attachment hardware 805, however, the cold plate 703 is easily lifted/peeled from the lid(s) of the chip package (s).

In various embodiments of the combo screw, the outer screw has an octagonal pan head that is tightened/loosened with a socket and socket wrench while the inner screw is a common phillips or regular head screw that is tightened/loosened with a phillips/regular screwdriver.

In the embodiment of FIGS. 7*a* through 7*h*, the inner screw secures the cold plate to the mounting hardware and the outer screw is used to peel the cold plate from the semiconductor chip packages. In other embodiments the reverse could be true. For example, the outer screw screws into the mounting hardware with the inner screw positioned as in FIG. 7*b*. Here, In order to peel the cold plate from the package lids, the outer screw is unthreaded from the mounting hardware but is still aligned with its corresponding hole (e.g., with a sleeve that fits around the outer screw). The inner screw is then tightened which drives the inner screw to the base of the hole in the mounting hardware. Further tightening presses the inner screw against the base which lifts the cold plate from the mounting hardware.

In various embodiments there are multiple combo screw attachments as described above per cold plate (e.g., one such combo screw per cold plate corner). In still other embodiments the combo screw is used simply to lift the cold plate from its chip packages and, e.g., only one (or two) combo screws are used per cold plate and other kinds of attachment fixtured are used to attach the cold plate to the mounting hardware.

In still other embodiments there is little no mounting hardware that emanates from the printed circuit board for the cold plate to attach to. That is, for example, no studs or posts emerge from a back plate or bolster plate. Rather, the cold plate is expected to mount to threaded holes in a back plate. In this case, the weight of the cold plate could be borne by the chip packages which could be problematic.

FIGS. 8*a,b,c* and 9*a,b* show different embodiments for an outer frame 831 that supports the weight of the cold plate 804 from above the cold plate 804, e.g., in the absence of specific mounting structures that emanate from the printed circuit board to support the cold plate.

FIGS. 8*a* and 8*b* show angled and side views respectively of an outer frame. Here, a mount 832 is attached to the cover of the cold plate 804. A screw 833 then connects the mount 832 to the frame 831. As such, the cold plate 804 essentially hangs from the frame 831 (or "floats" above the cold plate). Load screws 834 thread into holes in a back plate 835 that resides on the other side of the printed circuit board, which, in turn, presses the cold plate 804 against the chip packages to assure low thermal resistance between the chip packages and the cold plate, while, at the same time, the weight of the cold plate 804 is borne by the frame.

FIG. 8*c* shows the approach in which a single frame supports the weight of multiple cold plates. Although FIGS.

*8a,b,c* only show a cold plate that is coupled to a single chip package, the approach of FIGS. 8*a,b,c* extends to multiple chip package cold plates such as any of those described above.

FIGS. 9*a* and 9*b* show a similar approach but where the force that presses the cold plate into the chip package lid originates from the frame instead of loading screws that are mounted to the printed circuit board. In the approach of FIGS. 10*a* and 10*b*, mounting to the printed circuit board can be obviated because the frame only supports the weight of the cold plate but also is used as a base to provide the force that ensures good thermal efficiency between the cold plate and chip package lid.

In the approach of FIGS. 9*a* and 9*b*, the mount is secured to the frame 931 with a combo screw 933 having an inner screw and an outer screw (similar to the inner load and outer jack screw described above). More specifically, the mount 932 is secured to the cold plate 904 around the periphery of the cold plate 904 and is secured to the frame 901 through the outer screw portion of the combo screw.

Importantly, a piston 936 exists within the mount 932. Once the mount 932 is mounted to the frame 931 with the outer screw (and the cold plate 904), the inner screw is tightened to drive the inner screw into the piston 936. The piston is then driven into the cold plate 904 in response, which, in turn, presses the cold plate 904 into the chip package thereby ensuring good thermal efficiency between the cold plate 904 and the chip package. The periphery of the piston 936 is shaped so that is presses uniformly around the cold plate 904 thereby applying a uniform force against the chip package.

The approach of FIGS. 9*a* and 9*b* can be applied to multiple cold plates attached to a single frame as observed in FIG. 8*c*. Although FIGS. 9*a* and 9*b* only show a cold plate that is coupled to a single chip package, the approach of FIGS. 9*a* and 9*b* can be extended to multiple chip package cold plates such as any of those described above.

Note that any of the cold plate embodiments described above with respect to FIGS. 3*a* through 3*e* and FIGS. 4*a* through 4*c* can be mounted/peeled using any of the mounting/peeling mechanical design approaches described above with respect to FIGS. 5*a* through 5*c*, FIGS. 7*a* through 7*h*, FIGS. 8*a* through 8*c*, and FIGS. 9*a* and 9*b*. Moreover, any/all of the mounting/peeling mechanical design approaches described above with respect to FIGS. 5*a* through 5*c*, FIGS. 7*a* through 7*h*, FIGS. 8*a* through 8*c*, and 9*a,b* can be combined or otherwise cooperatively applied to a same cold plate fixturing solution. For example, the lever arm and cam of FIGS. 5*a* through 5*c* and the combo screw of FIGS. 7*a* through 7*h* could be applied to a cold plate that is supported by either of the outer frame approaches of FIGS. 8*a* through 8*c* and FIGS. 9*a* and 9*b*.

As is known in the art, traditional cold plate cooling entails cooled fluid entering one or more cold plates and being warmed by the heat generated by the respective cold plates' underlying semiconductor chips. The warmed fluid then exits the cold plates and is transferred via tubing to a heat exchanger or other cooling apparatus that cools the liquid. The cooled liquid is then returned to the cold plates via tubing and the process repeats Although embodiments above have stressed traditional cooling in which cooled fluid enters a cold plate and warmed fluid exits the cold plate, other embodiments can entertain two phase cooling in which liquid is evaporated within a vapor chamber that sits atop the chip package(s). In the case where the vapor condenses back to a liquid within the chamber, the chamber can be sealed (no ingress or egress tubing is connected to the vapor chamber). In the case where the vapor is condensed back to a liquid outside the vapor chamber, hot vapor exits the vapor chamber via egress tubing to an external condenser. The external condenser condenses the vapor back to a cooled liquid. The cooled liquid is then returned to the vapor chamber via ingress tubing.

The following discussion concerning FIGS. 10, 11 and 12 are directed to systems, data centers and rack implementations, generally. As such, FIG. 10 generally describes possible features of an electronic system that can include one or more semiconductor chip packages that are cooled according to the teachings above. FIG. 11 describes possible features of a data center that include such electronic systems. FIG. 12 describes possible features of a rack that includes such electronic systems.

FIG. 10 depicts an example system. System 1000 includes processor 1010, which provides processing, operation management, and execution of instructions for system 1000. Processor 1010 can include any type of microprocessor, central processing unit (CPU), graphics processing unit (GPU), processing core, a data processing unit (DPU) or infrastructure processing unit (IPU) or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function (e.g., a switch on a chip internal to the system), or, as a point of emphasis (e.g., a networking switch or router). Such systems can include one or more network processors to perform such networking functions (e.g., in a pipelined fashion or otherwise).

In one example, system 1000 includes interface 1012 coupled to processor 1010, which can represent a higher speed interface or a high throughput interface for system components that needs higher bandwidth connections, such as memory subsystem 1020 or graphics interface components 1040, or accelerators 1042. Interface 1012 represents an interface circuit, which can be a standalone component or integrated onto a processor die. Where present, graphics interface 1040 interfaces to graphics components for providing a visual display to a user of system 1000. In one example, graphics interface 1040 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1040 generates a display based on data stored in memory 1030 or based on operations executed by processor 1010 or both. In one example, graphics interface 1040 generates a display based on data stored in memory 1030 or based on operations executed by processor 1010 or both.

Accelerators 1042 can be a fixed function offload engine that can be accessed or used by a processor 1010. For example, an accelerator among accelerators 1042 can provide compression (DC) capability, cryptography services such as public key encryption (PKE), cipher, hash/authentication capabilities, decryption, or other capabilities or services. In some embodiments, in addition or alternatively, an accelerator among accelerators 1042 provides field select controller capabilities as described herein. In some cases, accelerators 1042 can be integrated into a CPU socket (e.g., a connector to a motherboard or circuit board that includes a CPU and provides an electrical interface with the CPU). For example, accelerators 1042 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic circuitry, and programmable processing elements such as field programmable gate arrays (FPGAs). Accelerators 1042 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1020 represents the main memory of system 1000 and provides storage for code to be executed by processor 1010, or data values to be used in executing a routine. Memory subsystem 1020 can include one or more memory devices 1030 such as read-only memory (ROM), flash memory, volatile memory, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software functionality to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010. In some examples, a system on chip (SOC or SoC) combines into one SoC package one or more of: processors, graphics, memory, memory controller, and Input/Output (I/O) control logic circuitry.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 1000 includes interface 1014, which can be coupled to interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can transmit data to a remote device, which can include sending data stored in memory. Network interface 1050 can receive data from a remote device, which can include storing received data into memory. Various embodiments can be used in connection with network interface 1050, processor 1010, and memory subsystem 1020.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data in a persistent state (e.g., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (e.g., the value or state of the data is indeterminate if power is interrupted to system 1000). In one example, storage subsystem 1080 includes controller 1082 to interface with storage 1084. In one example controller 1082 is a physical part of interface 1014 or processor 1010 or can include circuits in both processor 1010 and interface 1014.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 1000. More specifically, power source typically interfaces to one or multiple power supplies in system 1000 to provide power to the components of system 1000. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1000 can be implemented as a disaggregated computing system. For example, the system 1000 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Although a computer is largely described by the above discussion of FIG. 10, other types of systems to which the above described invention can be applied and are also partially or wholly described by FIG. 10 are communication systems such as routers, switches and base stations.

FIG. 11 depicts an example of a data center. Various embodiments can be used in or with the data center of FIG. 11. As shown in FIG. 11, data center 1100 may include an optical fabric 1112. Optical fabric 1112 may generally include a combination of optical signaling media (such as optical cabling) and optical switching infrastructure via which any particular sled in data center 1100 can send signals to (and receive signals from) the other sleds in data center 1100. However, optical, wireless, and/or electrical signals can be transmitted using fabric 1112. The signaling connectivity that optical fabric 1112 provides to any given sled may include connectivity both to other sleds in a same rack and sleds in other racks.

Data center 1100 includes four racks 1102A to 1102D and racks 1102A to 1102D house respective pairs of sleds 1104A-1 and 1104A-2, 1104B-1 and 1104B-2, 1104C-1 and 1104C-2, and 1104D-1 and 1104D-2. Thus, in this example, data center 1100 includes a total of eight sleds. Optical fabric 1112 can provide sled signaling connectivity with one or more of the seven other sleds. For example, via optical fabric 1112, sled 1104A-1 in rack 1102A may possess signaling connectivity with sled 1104A-2 in rack 1102A, as well as the six other sleds 1104B-1, 1104B-2, 1104C-1, 1104C-2, 1104D-1, and 1104D-2 that are distributed among the other racks 1102B, 1102C, and 1102D of data center 1100. The embodiments are not limited to this example. For example, fabric 1112 can provide optical and/or electrical signaling.

FIG. 12 depicts an environment 1200 that includes multiple computing racks 1202, each including a Top of Rack (ToR) switch 1204, a pod manager 1206, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 1208, and INTEL® ATOM™ pooled compute drawer 1210, a pooled storage drawer 1212, a pooled memory drawer 1214, and a pooled I/O drawer 1216. Each of the pooled system drawers is connected to ToR switch 1204 via a high-speed link 1218, such as a 40 Gigabit/second (Gb/s) or 100 Gb/s Ethernet link or an 100+Gb/s Silicon Photonics (SiPh) optical link. In one embodiment high-speed link 1218 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 1200 may be interconnected via their ToR switches 1204 (e.g., to a pod-level switch or data center switch), as illustrated by connections to a network 1220. In some embodiments, groups of computing racks 1202 are managed as separate pods via pod manager(s) 1206. In one embodiment, a single pod manager is used to manage all of the racks in the pod. Alternatively, distributed pod managers may be used for pod management operations. RSD environment 1200 further includes a management interface 1222 that is used to manage various aspects of the RSD environment. This includes managing rack configuration, with corresponding parameters stored as rack configuration data 1224.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store program code. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the program code implements various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:

a cold plate, the cold plate comprising:

a) an input port to receive fluid;

b) an ingress manifold to feed the fluid to different regions, each of the different regions to be located above its own respective semiconductor chip package;

c) an egress manifold to collect the fluid from the different regions;

d) an output port to emit the fluid from the cold plate; and e) a release mechanism comprising a lever arm and a cam, the cam to lift an end of the cold plate opposite an axis, in response to rotation of the lever arm, to cause the cold plate to rotate about the axis and peel from a semiconductor chip package that is farthest from the axis.

2. The apparatus of claim 1 wherein at least one of the different regions comprises finned channels.

3. The apparatus of claim 1 wherein at least one of the different regions comprises an arrangement of posts.

4. The apparatus of claim 1 wherein the cold plate further comprises a cooled fluid output port and a warmed fluid input port, the cooled fluid output port and the warmed fluid input port to be coupled to a satellite cold plate that is cooled by additional cooled fluid that is received by the input port.

5. The apparatus of claim 1 wherein the cold plate has slotted openings to allow the cold plate to mount to different arrangements of mounting hardware.

6. The apparatus of claim 1 wherein the input port and output port are flanged along an axis that the cold plate is to rotate about.

7. An apparatus, comprising:

a) a cold plate, the cold plate comprising i), ii), iii), iv) and v) below:

i) an input port to receive fluid, the input port flanged along an axis that the cold plate is to rotate about;

ii) an ingress manifold to feed the fluid to different regions, each of the different regions to be located above its own respective semiconductor chip package;

iii) an egress manifold to collect the fluid from the different regions; and iv) an output port to emit the fluid from the cold plate, the output port flanged along the axis; and b) a release mechanism comprising a lever arm and a cam, the cam to lift an end of the cold plate opposite the axis, in response to rotation of the lever arm, to cause the cold plate to rotate about the axis and peel from a semiconductor chip package that is farthest from the axis.

8. The apparatus of claim 7 wherein at least one of the different regions comprises finned channels.

9. The apparatus of claim 7 wherein at least one of the different regions comprises an arrangement of posts.

10. The apparatus of claim 7 wherein the cold plate further comprises a cooled fluid output port and a warmed fluid input port, the cooled fluid output port and the warmed fluid input port to be coupled to a satellite cold plate that is cooled by additional cooled fluid that is received by the input port.

11. The apparatus of claim 7 wherein the cold plate has slotted openings to allow the cold plate to mount to different arrangements of mounting hardware.

12. An apparatus, comprising:

a) a cold plate, the cold plate comprising i), ii), iii), iv) and v) below:

i) an input port to receive fluid, the input port flanged along an axis that the cold plate is to rotate about;

ii) an ingress manifold to feed the fluid to different regions, each of the different regions to be located above its own respective semiconductor chip package;

iii) an egress manifold to collect the fluid from the different regions; and iv) an output port to emit the fluid from the cold plate, the output port flanged along the axis; and b) a combination screw, the combination screw comprising an inner screw and an outer screw, one of the inner and outer screws to secure the cold plate to mounting hardware, an other of the inner and outer screws to peel the cold plate from at least one of the semiconductor chip packages.

13. The apparatus of claim 12 wherein at least one of the different regions comprises finned channels.

14. The apparatus of claim 12 wherein at least one of the different regions comprises an arrangement of posts.

15. The apparatus of claim 12 wherein the cold plate further comprises a cooled fluid output port and a warmed fluid input port, the cooled fluid output port and the warmed fluid input port to be coupled to a satellite cold plate that is cooled by additional cooled fluid that is received by the input port.

16. The apparatus of claim 12 wherein the cold plate has slotted openings to allow the cold plate to mount to different arrangements of mounting hardware.

* * * * *